(12) United States Patent
Taka et al.

(10) Patent No.: US 10,964,870 B2
(45) Date of Patent: *Mar. 30, 2021

(54) LED PACKAGE

(71) Applicant: Rohm Co., Ltd., Kyoto (JP)

(72) Inventors: Yosuke Taka, Kyoto (JP); Tomoichiro Toyama, Kyoto (JP); Junichi Itai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/884,973

(22) Filed: May 27, 2020

(65) Prior Publication Data

US 2020/0287114 A1   Sep. 10, 2020

Related U.S. Application Data

(63) Continuation of application No. 16/165,798, filed on Oct. 19, 2018, now Pat. No. 10,700,250.

(30) Foreign Application Priority Data

Jan. 22, 2018   (JP) .............................. JP2018-007883

(51) Int. Cl.
  *H01L 33/62* (2010.01)
  *H01L 33/56* (2010.01)
  *H01L 33/64* (2010.01)

(52) U.S. Cl.
  CPC .............. *H01L 33/62* (2013.01); *H01L 33/56* (2013.01); *H01L 33/641* (2013.01); *H01L 33/642* (2013.01)

(58) Field of Classification Search
  CPC ......... H01L 24/26; H01L 24/27; H01L 24/28; H01L 24/29; H01L 24/30; H01L 24/31; H01L 24/32; H01L 24/33; H01L 33/62
  See application file for complete search history.

(56) References Cited

U.S. PATENT DOCUMENTS 4,875,617 A   10/1989   Citowsky
5,110,761 A   5/1992   Kalfus et al.
(Continued)

FOREIGN PATENT DOCUMENTS

JP   2001168444 A   *   6/2001   .......... H01S 5/0224
JP   2013219090 A       10/2013

OTHER PUBLICATIONS

Machine translation, Ozawa, Japanese Pat. Pub. No. JP 2001-168444, translation date: Jun. 9, 2020, Espacenet, all pages. (Year: 2020).*

*Primary Examiner* — Victoria K. Hall
(74) *Attorney, Agent, or Firm* — Hamre, Schumann, Mueller & Larson, P.C.

(57) ABSTRACT

The present disclosure provides a light emitting diode (LED) package, which ensures the reliability during use while adopting an LED chip of higher output. The LED package includes an LED chip, which has a front and a back facing opposite sides in the thickness direction z, and a first back electrode provided at the back surface; a first terminal in conduction with the first back electrode; and a first bonding layer, configured to bond the first back electrode and the first terminal 201; wherein the composition of the first bonding layer includes a metal eutectic composition containing Au, and when the LED chip is viewed in the thickness direction z, a first bent portion which is recessed toward the inner side of the periphery of the first back electrode is formed in the first bonding layer.

20 Claims, 29 Drawing Sheets

(56) References Cited

U.S. PATENT DOCUMENTS

| | | | |
|---|---|---|---|
| 5,534,666 A | 7/1996 | Ishida | |
| 6,021,149 A | 2/2000 | Miyazaki et al. | |
| 6,500,760 B1 | 12/2002 | Peterson et al. | |
| 6,683,387 B1 | 1/2004 | Brownfield | |
| 7,423,337 B1* | 9/2008 | Patwardhan | H01L 21/563 257/686 |
| 9,263,412 B2* | 2/2016 | Lin | B23K 35/24 |
| 9,318,460 B2 | 4/2016 | Sakuma et al. | |
| 9,806,045 B2 | 10/2017 | Lu et al. | |
| 9,941,233 B2* | 4/2018 | Matsubara | H01L 23/49548 |
| 10,446,721 B2 | 10/2019 | Lin et al. | |
| 10,541,217 B2 | 1/2020 | Wu | |
| 10,700,250 B2* | 6/2020 | Taka | H01L 33/62 |
| 2005/0110161 A1* | 5/2005 | Naito | H01L 24/75 257/778 |
| 2005/0127508 A1 | 6/2005 | Lee et al. | |
| 2005/0224560 A1* | 10/2005 | Takesue | B23K 1/0016 228/180.22 |
| 2007/0076390 A1 | 4/2007 | Kroener et al. | |
| 2009/0108421 A1 | 4/2009 | Nelle et al. | |
| 2011/0084386 A1 | 4/2011 | Pendse | |
| 2011/0127680 A1 | 6/2011 | Masuda et al. | |
| 2012/0013005 A1 | 1/2012 | Ahmad et al. | |
| 2012/0061811 A1 | 3/2012 | Nelle et al. | |
| 2012/0238118 A1 | 9/2012 | Yoshida et al. | |
| 2012/0298416 A1 | 11/2012 | Ziegler et al. | |
| 2013/0248916 A1* | 9/2013 | Suehiro | H01L 24/17 257/99 |
| 2014/0084329 A1 | 3/2014 | Horio | |
| 2014/0096379 A1* | 4/2014 | Saeki | H01L 24/92 29/832 |
| 2014/0110166 A1 | 4/2014 | Degen et al. | |
| 2014/0117533 A1 | 5/2014 | Lei et al. | |
| 2014/0158424 A1 | 6/2014 | Schlarb et al. | |
| 2014/0170913 A1 | 6/2014 | Degen et al. | |
| 2014/0182932 A1 | 7/2014 | Cholewa et al. | |
| 2014/0345939 A1 | 11/2014 | Nakano et al. | |
| 2015/0076538 A1 | 3/2015 | Lei et al. | |
| 2015/0200181 A1 | 7/2015 | Haga et al. | |
| 2015/0348877 A1 | 12/2015 | Huang et al. | |
| 2016/0181219 A1 | 6/2016 | Hu et al. | |
| 2016/0242289 A1 | 8/2016 | Kim et al. | |
| 2016/0252688 A1* | 9/2016 | Barwicz | H01S 5/02252 385/14 |
| 2016/0276174 A1 | 9/2016 | Kim et al. | |
| 2017/0038055 A1 | 2/2017 | Daniels | |
| 2017/0062374 A1 | 3/2017 | Chu et al. | |
| 2017/0345786 A1 | 11/2017 | Chen et al. | |
| 2018/0019234 A1 | 1/2018 | Hu | |
| 2018/0159300 A1 | 6/2018 | Kainuma et al. | |
| 2018/0174008 A1 | 6/2018 | Lu et al. | |
| 2018/0286734 A1* | 10/2018 | Meitl | H01L 21/6835 |
| 2019/0097387 A1 | 3/2019 | Tsai et al. | |
| 2019/0143434 A1 | 5/2019 | Yoneda et al. | |
| 2019/0237392 A1 | 8/2019 | Kwon | |
| 2019/0267288 A1 | 8/2019 | Masuko et al. | |
| 2020/0052173 A1 | 2/2020 | Obuchi et al. | |
| 2020/0058630 A1 | 2/2020 | von Malm et al. | |

\* cited by examiner

LED PACKAGE

PRIORITY CLAIM AND CROSS-REFERENCE

This patent application claims priority to U.S. patent application Ser. No. 16/165,798, filed Oct. 19, 2018, now U.S. Pat. No. 10,700,250, issued Jun. 30, 2020, which claims priority to Japan patent application Ser. No. 2018-007883, filed on Jan. 22, 2018, which is incorporated by reference in its entirety.

TECHNICAL FIELD

The present disclosure relates to LED packages using LED chips with the back electrode.

DISCUSSION OF THE BACKGROUND

Patent literature 1 discloses an example of an LED package to which an LED chip having a back electrode is used. In the LED package, a conductive pattern for mounting and a conductive pattern for bonding a bonding wire are formed on an insulating substrate. The back electrode of the LED chip is bonded to the mounting conductive pattern using a chip bonding material (bonding material). One end of a bonding wire is connected to the bonding wire bonding conductive pattern, and the other end of the bonding wire is connected to the front-side electrode of the LED chip. The die bonding material used therein is a conductive silver paste.

In this case, since the silver paste is a hygroscopic material, when the silver paste is used for chip bonding, the chip bonding material may absorb moisture when using the LED package. If the chip bonding material absorbs moisture, there is concern that the efficiency of the power supplied to the LED chip via the chip bonding material will decrease. Also, since the silver paste has a relatively low electric conductivity, there is a problem that an LED package to which the silver paste is used for chip bonding is not suitable for use in an LED chip of higher output.

PRIOR TECHNICAL LITERATURE

Patent Literature

[Patent literature 1] The specification of Japan patent application publication No. 2013-219090.

SUMMARY

Problems to be Solved in the Present Invention

In view of the foregoing, one purpose of the present invention is to provide an LED package, which ensures the reliability during use while adopting an LED chip of higher output.

Technical Means for Solving Problems

According to embodiments of the present disclosure, an LED package is provided, wherein the LED package comprises: an LED chip, which has a front and a back facing opposite sides in the thickness direction z, and a first back electrode provided at the back surface; a first terminal in conduction with the first back electrode; and a first bonding layer, configured to bond the first back electrode and the first terminal; and the composition of the first bonding layer includes a metal eutectic composition containing Au, wherein when the LED chip is viewed in the thickness direction z, a first bent portion which is recessed toward the inner side of the periphery of the first back electrode is formed in the first bonding layer.

In preferred embodiments of the present disclosure, the composition of the first bonding layer further comprises at least one of Sn and In.

In preferred embodiments of the present disclosure, a junction between the first terminal and the first bonding layer comprises a section located further outside the periphery of the first back electrode, when viewed in the thickness direction of the LED chip.

In preferred embodiments of the present disclosure, the periphery of the first back electrode is located further inside a periphery of the back, when viewed in the thickness direction of the LED chip.

In preferred embodiments of the present disclosure, the LED chip further comprises a cutting surface that intersects with the back, wherein the cutting surface tilts relative to the back.

In preferred embodiments of the present disclosure, the LED chip further comprises a sealing resin that covers the LED chip and is light-transmissive, wherein the sealing resin is in contact with the first bent portion.

In preferred embodiments of the present disclosure, the sealing resin comprises epoxy.

In preferred embodiments of the present disclosure, the LED chip further comprises a second terminal, wherein the second terminal is separated from the first terminal in a direction orthogonal to the thickness direction of the LED chip; the LED chip further comprises a front-side electrode provided at the front and in conduction with to the second terminal.

In preferred embodiments of the present disclosure, the LED chip further comprises a wire, wherein the wire connects the front-side electrode and the second terminal.

In preferred embodiments of the present disclosure, the LED chip further comprises a second back electrode, wherein the second back electrode is provided at the back and separated from the first back electrode; the LED package further comprises a second terminal, which is separated from the first terminal in a direction orthogonal to the thickness direction of the LED chip, and is in conduction with the second back electrode; and a second bonding layer, which is configured to bond the second back electrode and the second terminal; and composition of the second bonding layer is the same as the composition of the first bonding layer; wherein the second bonding layer has a second bent portion recessed toward the inner side of a periphery of the second back electrode, when viewed in the thickness direction of the LED chip.

In preferred embodiments of the present disclosure, a junction between the second terminal and the second bonding layer comprises a section located further outside the periphery of the second back electrode, when viewed in the thickness direction of the LED chip.

In preferred embodiments of the present disclosure, the sealing resin is in contact with the second bent portion.

In preferred embodiments of the present disclosure, the LED chip further comprises a substrate that comprises a substrate front facing the same orientation as the front and a substrate back facing an orientation opposite from the substrate front, wherein the substrate is configured to support the first terminal and the second terminal, and the first terminal and the second terminal respectively comprise a front portion provided at the substrate front, a back portion provided at the substrate back, and a middle portion configured to connect the front portion and the back portion.

In preferred embodiments of the present disclosure, the substrate further comprises a pair of substrate sidewalls intersecting with the substrate front and the substrate back, and the pair of substrate sidewalls are separated from each other in a direction that is the same as the direction in which the first terminal is separated from the second terminal; the substrate has a groove recessed from each of the substrate sidewalls, and reaches the substrate back from the substrate front, and the middle portion is provided in the groove.

In preferred embodiments of the present disclosure, the LED chip further comprises a case made of a synthetic resin, which comprises a top surface that faces in the same orientation as the front and a dent that is recessed from the top surface, wherein the case is configured to support the first terminal and the second terminal, and both the LED chip and the sealing resin accommodated in the dent.

In preferred embodiments of the present disclosure, the dent comprises a bottom surface that is configured to be parallel with the top surface and an inner peripheral surface that is configured to connect the top surface and the bottom surface and surround the LED chip, wherein the inner peripheral surface tilts relative to the bottom surface.

In preferred embodiments of the present disclosure, a respective portion of the first terminal and the second terminal exposes from the bottom surface.

Effects of the Present Invention

The LED package according to embodiments of the present disclosure ensures the reliability during use while adopting an LED chip of higher output.

Other features and advantages of the present disclosure are more apparent in view of the detailed description below in conjunction with the appended drawings.

DETAILED DESCRIPTION

The present invention is described hereinbelow based on preferred embodiments thereof by referencing to the appended drawings.

First Embodiment

Figure 1:
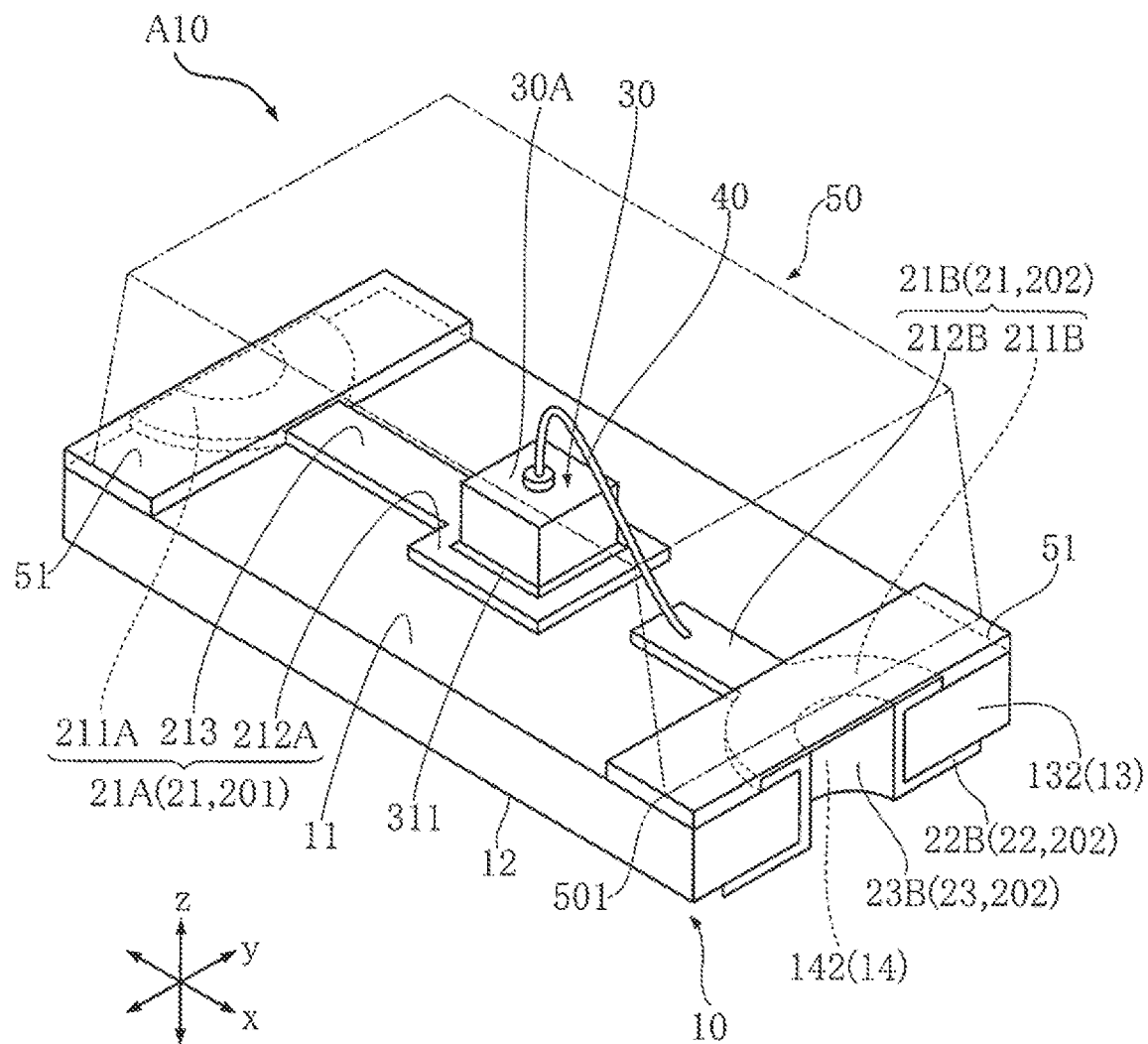
FIG. 1 is a stereogram an LED package (through the sealing resin) according to a first embodiment of the present invention.
Figure 2:
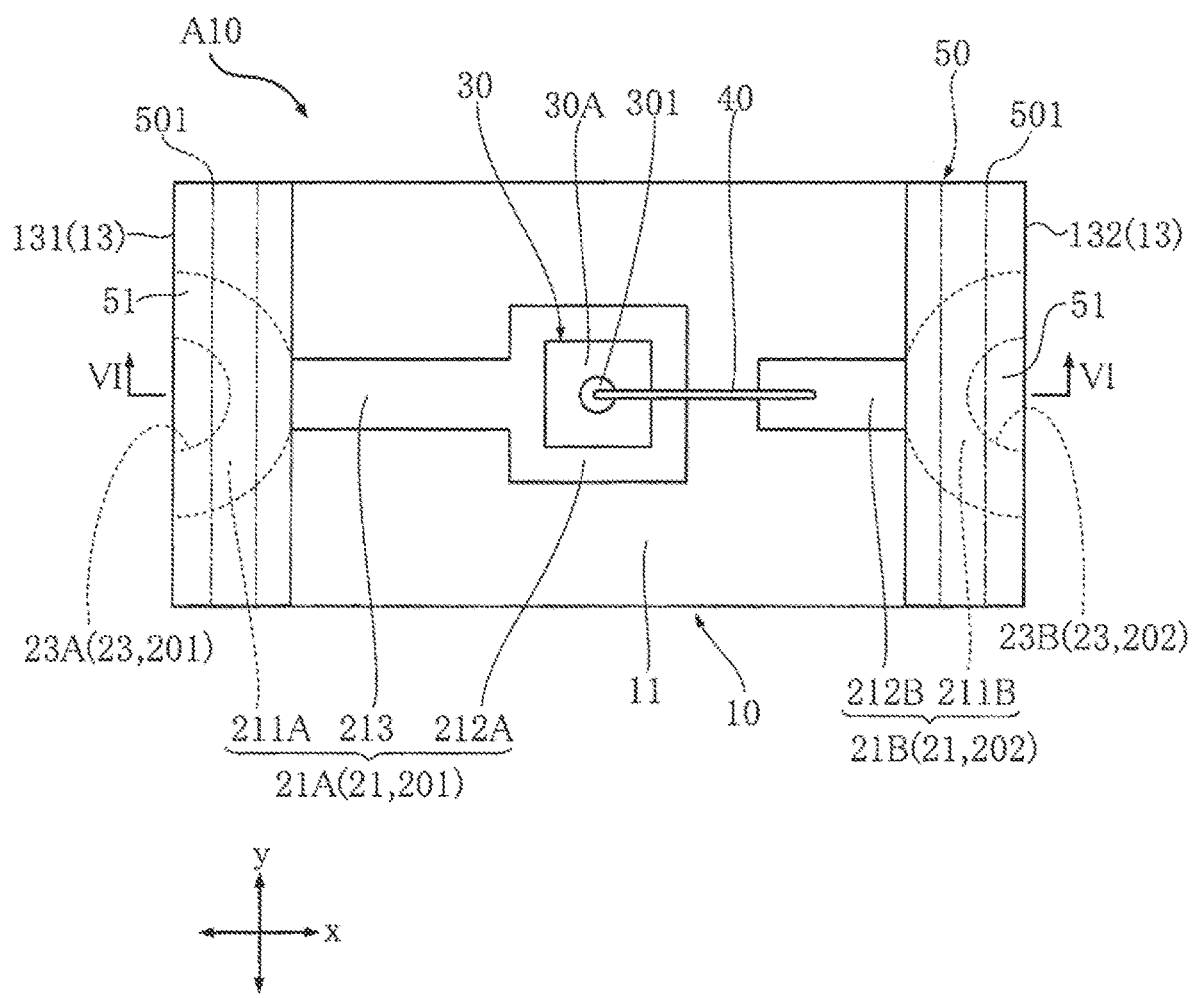
FIG. 2 is a top view of the LED package (through the sealing resin) shown in FIG. 1.
Figure 10:
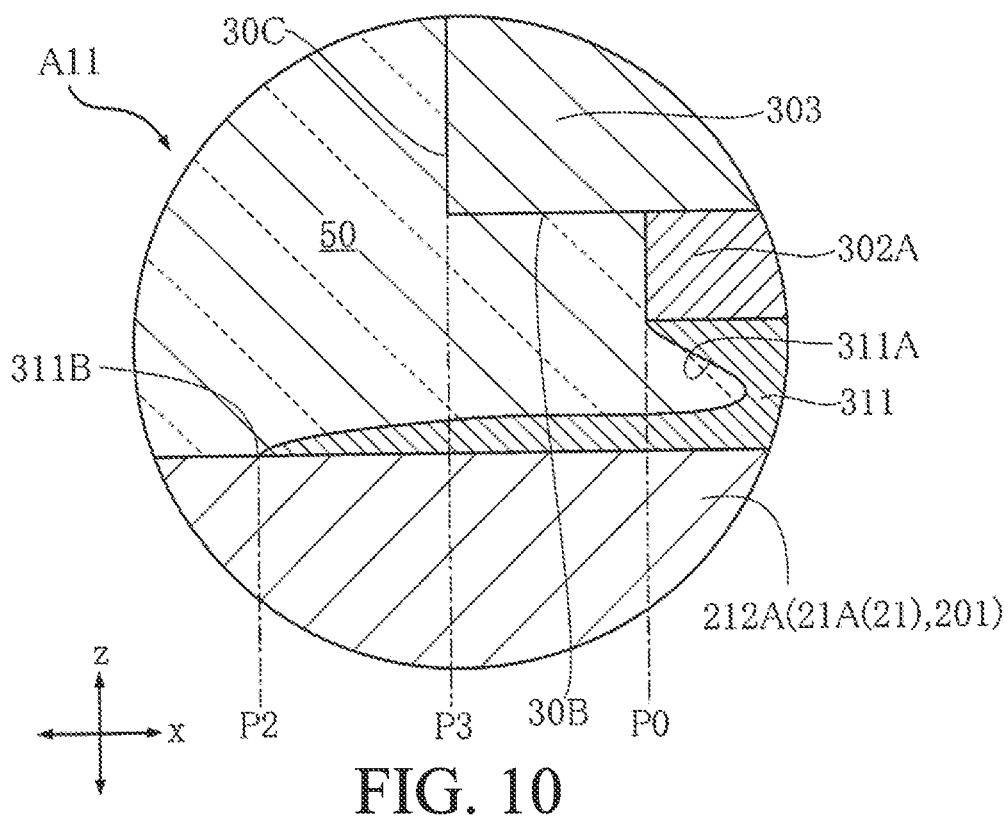
FIG. 10 is a partial enlargement view (near the first bonding layer) of a first variant of the LED package shown in FIG. 1.
Figure 11:
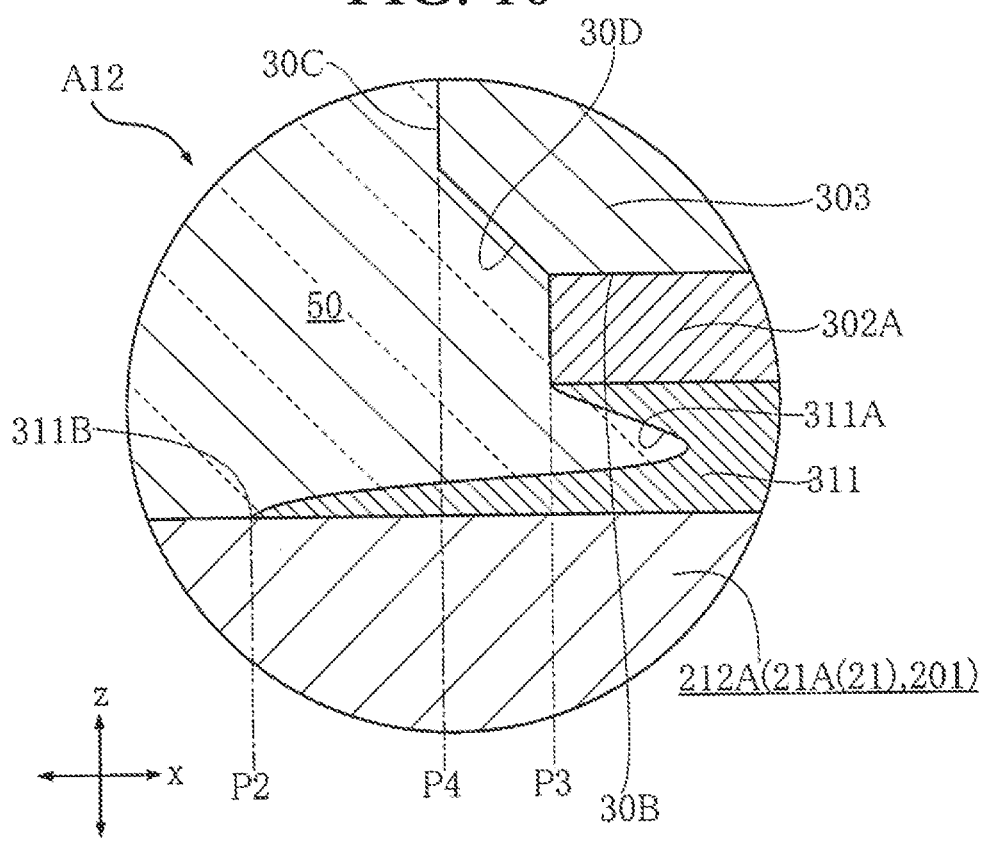
FIG. 11 is a partial enlargement view (near the first bonding layer) of a second variant of the LED package shown in FIG. 1.

The LED package A10 according to the first embodiment of the present invention is discussed with reference to FIG. 1 to FIG. 11. The LED package A10 comprises a substrate 10, a first terminal 201, a second terminal 202, a LED chip 30, a first bonding layer 311, a wire 40, a sealing resin 50, and a covering material 51. Here, FIG. 1 and FIG. 2 are illustrated through the sealing resin 50 to facilitate the understanding of the present invention. In these drawings, the outline of the sealing resin 50 that has been passed through is indicated by an imaginary line (two-dot chain line). To facilitate the understanding, the components of the LED chip 30 other than the first back electrode 302A are shown in FIG. 9 (see, the discussion below). The cross-section of FIG. 10 and FIG. 11 is the same as that of FIG. 8.

The LED package A10 shown in these drawings is a surface-mount type package in which the first terminal 201 and the second terminal 202 are supported by the substrate 10. As illustrated in FIG. 1 and FIG. 2, when viewed in the thickness direction z (hereinafter, the "top view") of the LED chip 30, the LED package A10 is rectangular in shape. Here, for the sake of discussion, the direction of the long side of LED package A10 which is orthogonal to the thickness direction z of the LED chip 30 (hereinafter, the "thickness direction z") is referred to as the first direction x. Further, the direction of the short side of LED package A10 which is orthogonal to the thickness direction z and the first direction x is referred to as the second direction y.

Figure 3:
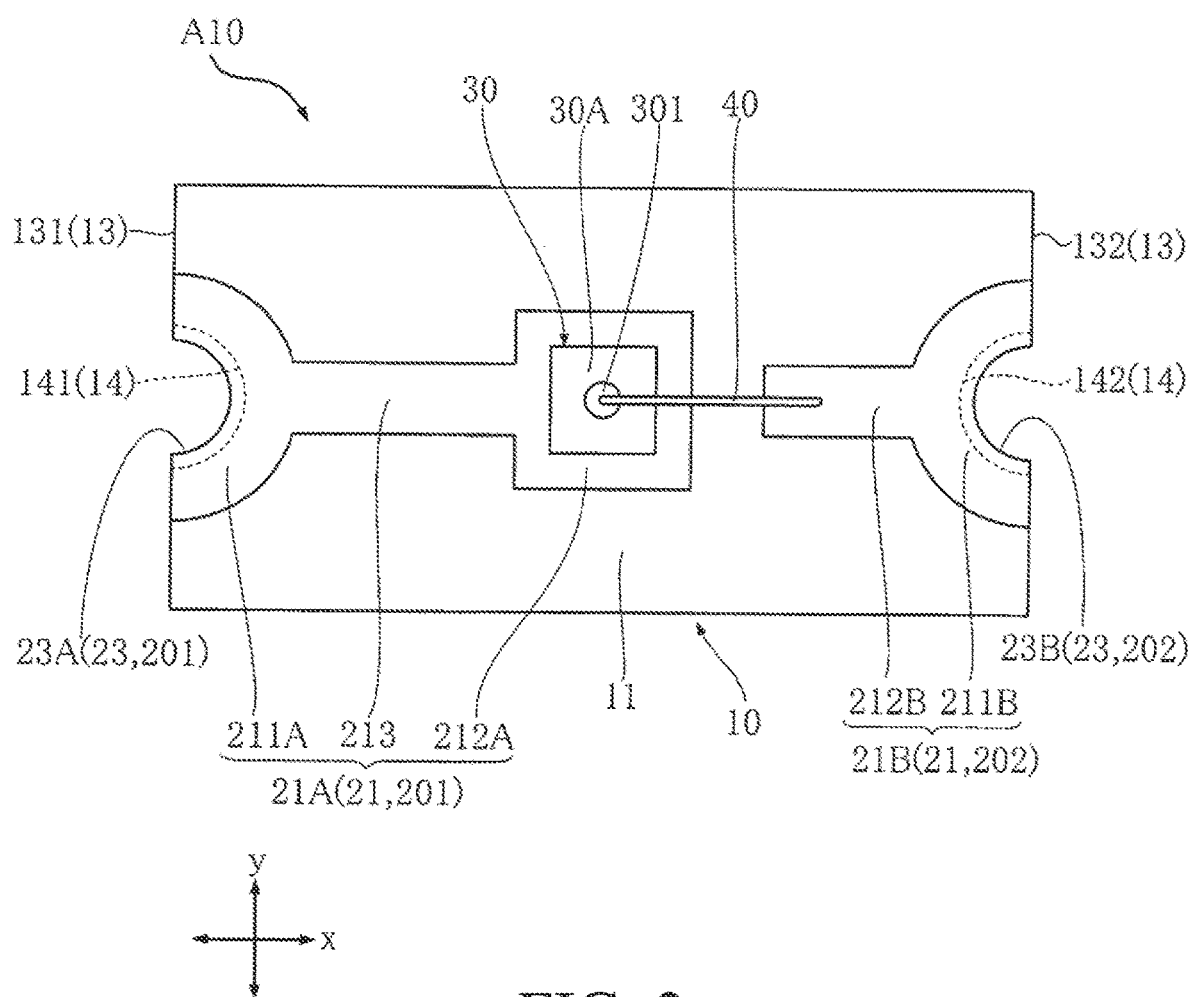
FIG. 3 is a top view in which the sealing resin and the covering material are omitted from FIG. 2.

As shown in FIG. 1, the substrate 10 is an electric-insulating component configured to support the first terminal 201, the second terminal 202, and the sealing resin 50. The substrate 10 is made of, for example, glass-filled epoxy or $Al_2O_3$. As illustrated in FIG. 2 and FIG. 3, when viewed in top view, the substrate 10 is rectangular in shape and extends in the first direction x. The substrate 10 has a substrate front 11, a substrate back 12, and a pair of substrate sidewalls 13.

As shown in FIG. 1 to FIG. 6 (except FIG. 4), the substrate front 11 faces toward one side in the thickness direction z. A first front portion 21A of the first terminal 201 (see detailed discussion below) and a second front portion 21B of the second terminal 202 (see detailed discussion below) are provided at the substrate front 11. Further, in this embodiment, a covering material 51 is disposed at the substrate front 11.

As shown in FIG. 1 to FIG. 6 (except FIG. 2 and FIG. 3), the substrate back 12 faces toward the other side in the thickness direction z. Hence, the substrate front 11 and the substrate back 12 faces in opposite orientations in the thickness direction z. A first back portion 22A (see detailed discussion below) of the first terminal 201 and a second back portion 22B of the second terminal 202 (see detailed discussion below) for mounting the LED package A10 on a target wiring substrate are provided at the back 12 of the substrate.

As shown in FIG. 1 to FIG. 5, each of the pair of substrate sidewalls 13 intersects with the substrate front 11 and the substrate back 12. The pair of substrate sidewalls 13 are spaced apart in the first direction x in which the first terminal 201 and the second terminal 202 are separated from each other. Moreover, for the purpose of discussion, one substrate sidewall 13 of the pair of substrate sidewalls 13 is referred to as a first sidewall 131, whereas the other substrate sidewall 13 is referred to as a second sidewall 132.

As illustrated in FIG. 1 to FIG. 6 (except FIG. 2), the substrate 10 has a groove 14, which is recessed from each substrate sidewall 13 and reaches the substrate back 12 from the substrate front 11. In the present embodiment, the cross section of the recessed groove 14 in the thickness direction z is semicircular. The recessed groove 14 has a first region 141 that is recessed from the first sidewall 131 and a second region 142 that is recessed from the second sidewall 132. A first middle portion 23A of the first terminal 201 (see detailed discussion below) is provided in the first region 141. A second middle portion 23B (see detailed discussion below) of the second terminal 202 is provided in the second region 142.

As illustrated in FIG. 1 to FIG. 6 (except FIG. 4 and FIG. 5), the first terminal 201 is a conductive part for bearing the LED chip 30. The first terminal 201 is conducted with the first back electrode 302A of the LED chip 30 (see detailed discussion below) via the first bonding layer 311. The first terminal 201 consists of a copper (Cu) foil and a plated layer deposited on the Cu foil. The composition of the plated layer comprises, for example, Ni, Pd, and Au. Further, the composition of the plated layer may also comprise Ag. Furthermore, the plated layer is formed by electroplating. The first terminal 201 comprises a front portion 21, a back portion 22, and middle portion 23. Here, for the purpose of discussion, the front portion 21 of the first terminal 201 is referred to as the first front portion 21A, the back portion 22 of the first terminal 201 is referred to as the first back portion 22A, and the middle portion 23 of the first terminal 201 is referred to as the first middle portion 23A. The same references are used in the following descriptions in connection with the LED package A20.

Figure 6:
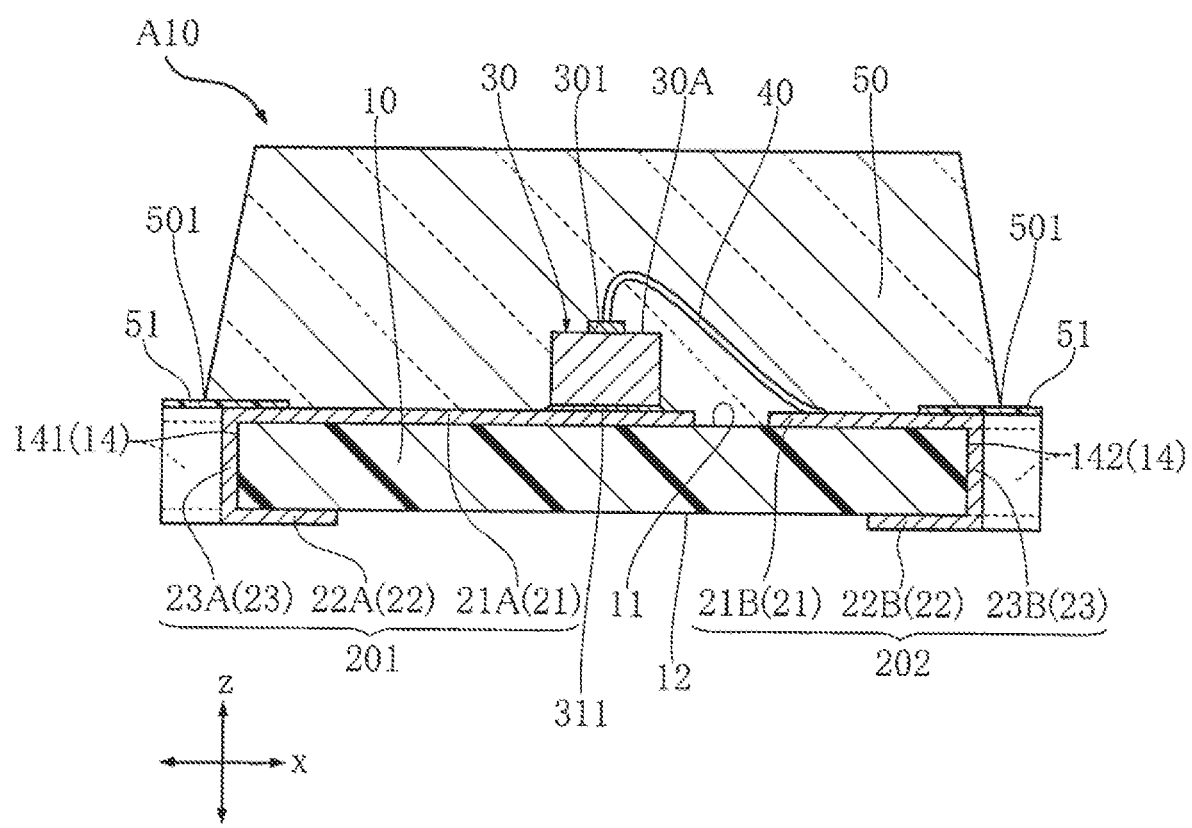
FIG. 6 is a sectional view taken along the line VI-VI in FIG. 2.

As illustrated in FIG. 2, FIG. 3, and FIG. 6, the first front portion 21A is provided at the substrate front 11. The first front portion 21A comprises a first base portion 211A, a first connection portion 212A, and a coupling portion 213. The first base portion region 211A is semicircular, when being viewed from the top. A part of the periphery of the first base portion region 211A is positioned at the junction between the substrate front 11 and the first sidewall 131 (substrate sidewall 13) and the first region 141 (the concave groove 14). Among them, at the junction between the substrate front 11 and the first region 141, the first middle portion 23A is connected to the first base portion 211A. The LED chip 30 is mounted on the first connection portion 212A. In the top view, the periphery of the first connection portion 212A is positioned further outside the periphery of the LED chip 30. The coupling portion 213 connects the first base portion 211A and the first connection portion 212A. In the top view, the coupling portion 213 has a strip extending in the first direction x.

Figure 4:
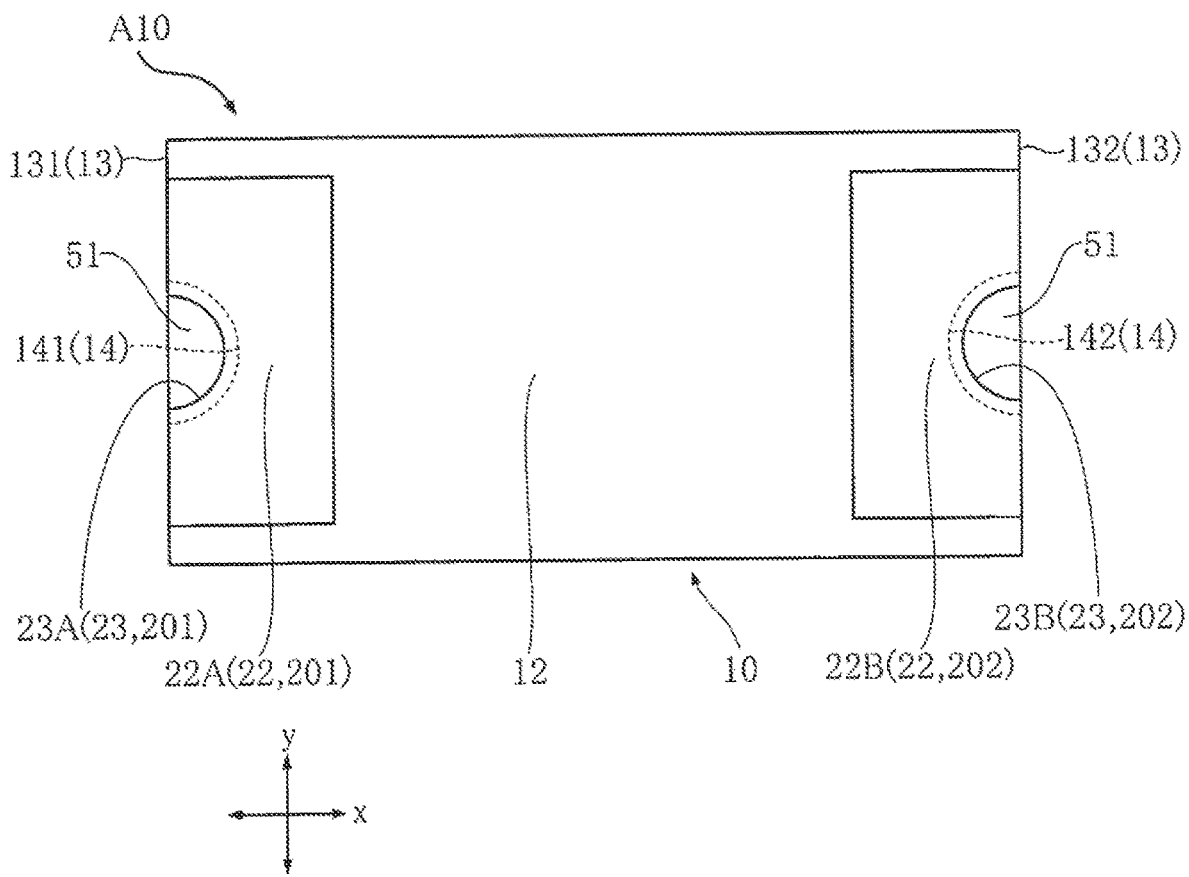
FIG. 4 is a bottom view of the LED package shown in FIG. 1.
Figure 5:
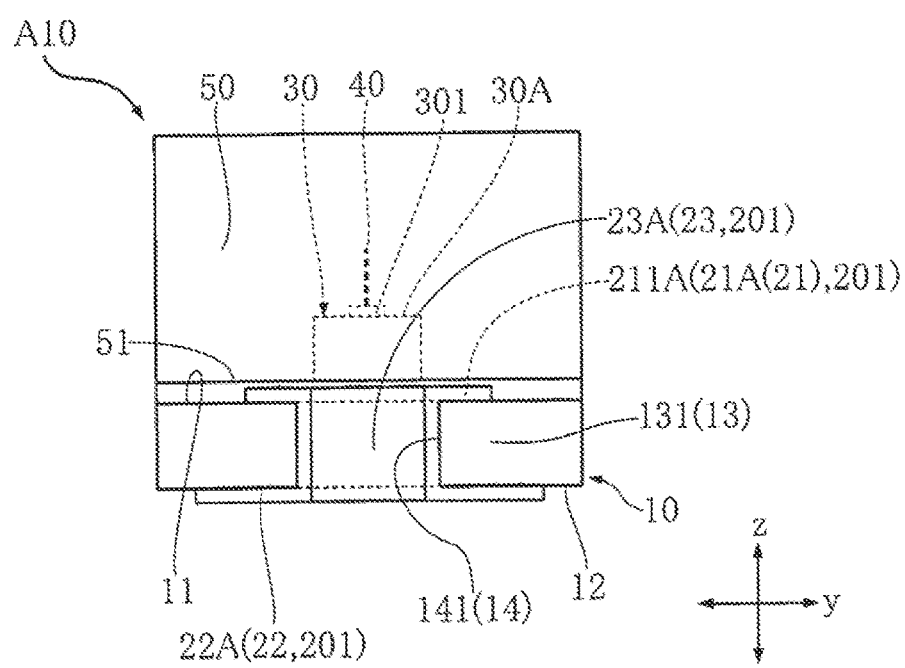
FIG. 5 is a left side view of the LED package shown in FIG. 1.

As illustrated in FIG. 4 and FIG. 6, the first back portion 22A is provided at the substrate back 12. A part of the periphery of the first back portion 22A is positioned at the junction between the substrate back 12 and the first sidewall 131 (substrate sidewall 13) and the first region 141 (the recessed groove 14). Among them, the first middle portion 23A is connected to the first back portion 22A at the junction between the substrate back 12 and the first region 141.

As illustrated in FIG. 3 to FIG. 6, the first middle portion 23A is provided at the first region 141 (groove 14) and connects the first front portion 21A (first base portion 211A) and the first back portion 22A. Hence, at the first terminal 201, the first front portion 21A and the first back portion 22A are conducted with each other via the first middle portion 23A.

As illustrated in FIG. 1 to FIG. 6 (except FIG. 4 and FIG. 5), the second terminal 202 is spaced apart from the first terminal 201 in the first direction x. The second terminal 202 is conducted with the front-side electrode 301 of the LED chip 30 (see detailed discussion below) via the wire 40. The composition of the second terminal 202 is the same as that of the first terminal 201. Like the first terminal 201, the second terminal 202 also comprises a front portion 21, a back portion 22, and a middle portion 23. Here, for the purpose of discussion, the front portion 21 of the second terminal 202 is referred to as the second front portion 21B, the back portion 22 of the second terminal 202 is referred to as the second back portion 22B, and the middle portion 23 of the second terminal 202 is referred to as the second middle portion 23B. The same references are used in the following descriptions in connection with the LED package A20.

As illustrated in FIG. 2, FIG. 3, and FIG. 6, the second front portion 21B is provided at the substrate front 11. The second front portion 21B comprises a second base portion 211B and a second connection portion 212B. The second base portion 211B is semicircular, when being viewed from the top. A part of the periphery of the second base portion 211B locates at the junction between the substrate front 11 and the second sidewall 132 (substrate sidewalls 13) and the second region 142 (groove 14). Among them, the second middle portion 23B is connected to the second base portion 211B at the junction between the substrate front 11 and the second region 142. In the top view, the second connection portion 212B has a strip extending from the second base portion 211B toward the first connection portion 212A (the front portion 21A). A wire 40 is connected to the second connection portion 212B.

As illustrated in FIG. 4 and FIG. 6, the second back portion 22B is provided at the substrate back 12. A part of the periphery of the second back portion 22B is located at the junction between the substrate back 12 and the second sidewall 132 (substrate sidewalls 13) and the second region 142 (groove 14). Among them, the second middle portion 23B is connected to the second back portion 22B at the junction between the substrate back 12 and the second region 142.

As illustrated in FIG. 3 to FIG. 6, the second middle portion 23B is provided at the second region 142 (the groove 14) and connects the second front portion 21B (second base portion 211B) and the second back portion 22B. Therefore, the second front portion 21B and the second back portion 22B are connected with each other via the second middle portion 23B at the second terminal 202.

Figure 7:
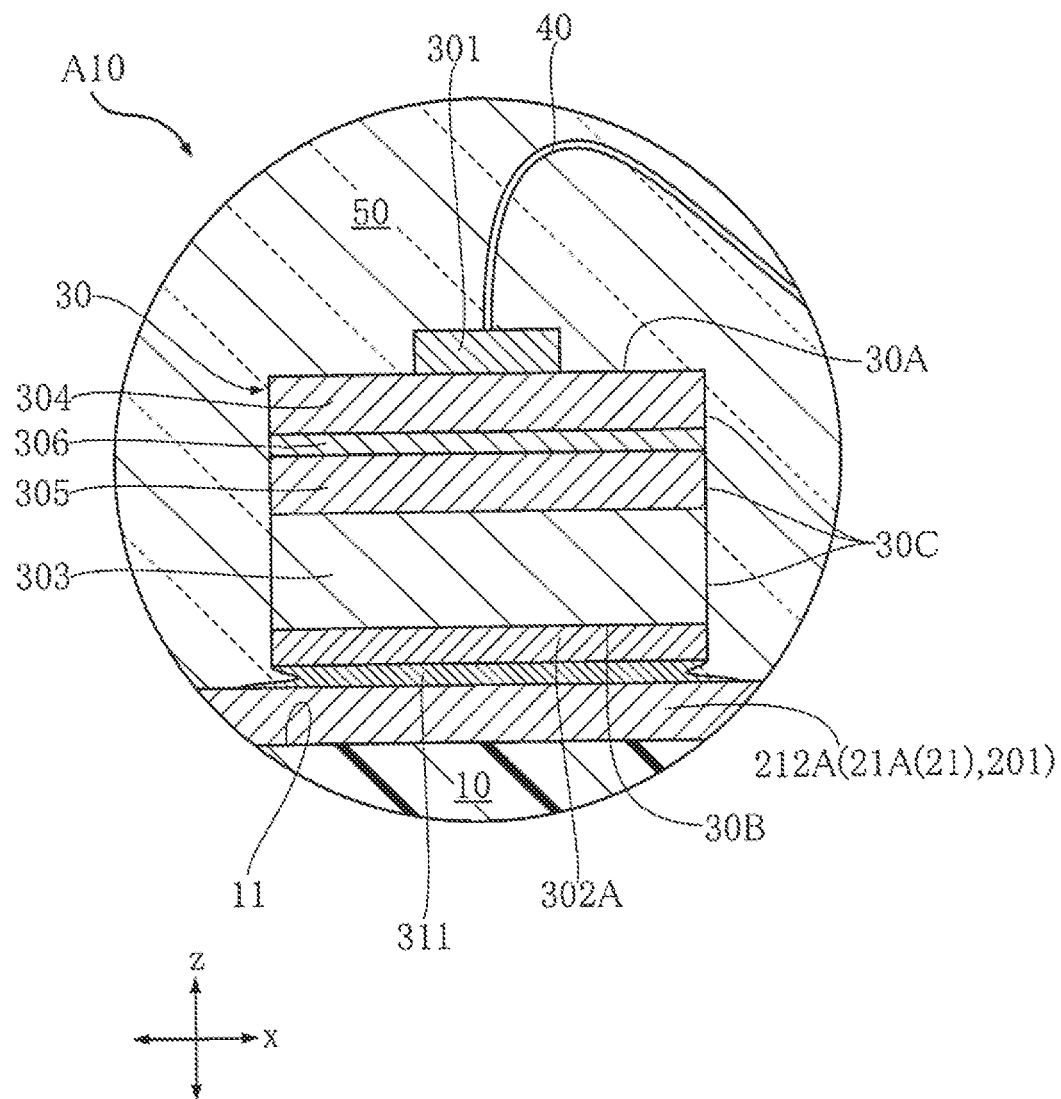
FIG. 7 is a partial enlargement view (near the LED chip) of the LED package shown in FIG. 6.

As illustrated in FIG. 7, the LED chip 30 comprises a front-side electrode 301, a first back electrode 302A, a substrate 303, a p-type semiconductor layer 304, an n-type semiconductor layer 305, and an active layer 306. Among them, the active layer 306 sandwiched between the p-type semiconductor layer 304 and the n-type semiconductor layer 305 is the light-emitting portion of the LED chip 30. Further, the LED chip 30 comprises a front 30A, a back 30B, and sidewalls 30C. The front 30A faces toward the thickness direction z (the upper side as in FIG. 7) and constitutes a portion of the p-type semiconductor layer 304. The back 30B faces toward the thickness direction z (the lower side as in FIG. 7) and constitutes a portion of the substrate 303. Therefore, the front 30A and back 30B face in opposite orientations with each other along the thickness direction z. The sidewalls 30C intersects with the front 30A and the back 30B. The sidewalls 30C comprises a plurality of regions; each region constitutes, respectively, a portion of the substrate 303, the p-type semiconductor layer 304, the n-type semiconductor layer 305, and the active layer 306. In this embodiment, the material forming the substrate 303 is GaAs. The material forming the p-type semiconductor layer 304 and the n-type semiconductor layer 305 comprises, primarily, for example, GaN. The material forming the active layer 306 comprises, Al, Ga, In, and P.

As illustrated in FIG. 7, the front-side electrode 301 is disposed at the front 30A. The front-side electrode 301 corresponds to the p-side electrode (the anode) of the LED chip 30. The composition of the front-side electrode 301 is, for example, Au. The wire 40 is connected to the front-side electrode 301, and hence, the front-side electrode 301 is conducted with the second terminal 202. Further, the first back electrode 302A is disposed at the back 30B. The first back electrode 302A corresponds to the n-side electrode (the cathode) of the LED chip 30. The composition of the first back electrode 302A comprises, for example, Ti and Au. The first back electrode 302A faces the first connection portion 212A (the first front portion 21A of the first terminal 201) across the first bonding layer 311. In this embodiment, the first back electrode 302A is provided across the entire back 30B.

As illustrated in FIG. 7, the first bonding layer 311 is a conductive part that connects the first back electrode 302A and the first terminal 201 (the first connection portion 212A of the first front portion 21A). Therefore, the first back electrode 302A is conducted with the first terminal 201. The first bonding layer 311 is a so-called die bonding material of the LED chip 30. The composition of the first bonding layer 311 is a metal eutectic composition comprising Au. In this embodiment, the composition of the first bonding layer 311 comprises Au and Sn.

When the ratio (weight ratio) of Au to Sn is 8:2, the melting point of the first bonding layer 311 is 288° C. Further, the composition of the first bonding layer 311 may also comprise Au and In. The first bonding layer 311 is deposited on the first back electrode 302A. When bonding the LED chip 30 to the first terminal 201, the first bonding layer 311 is brought into contact with the first terminal 201, and the first bonding layer 311 is melted by reflowing under an inert gas (such as $N_2$). When the first bonding layer 311 is solidified by cooling, the LED chip 30 is bonded to the first terminal 201.

Figure 8:
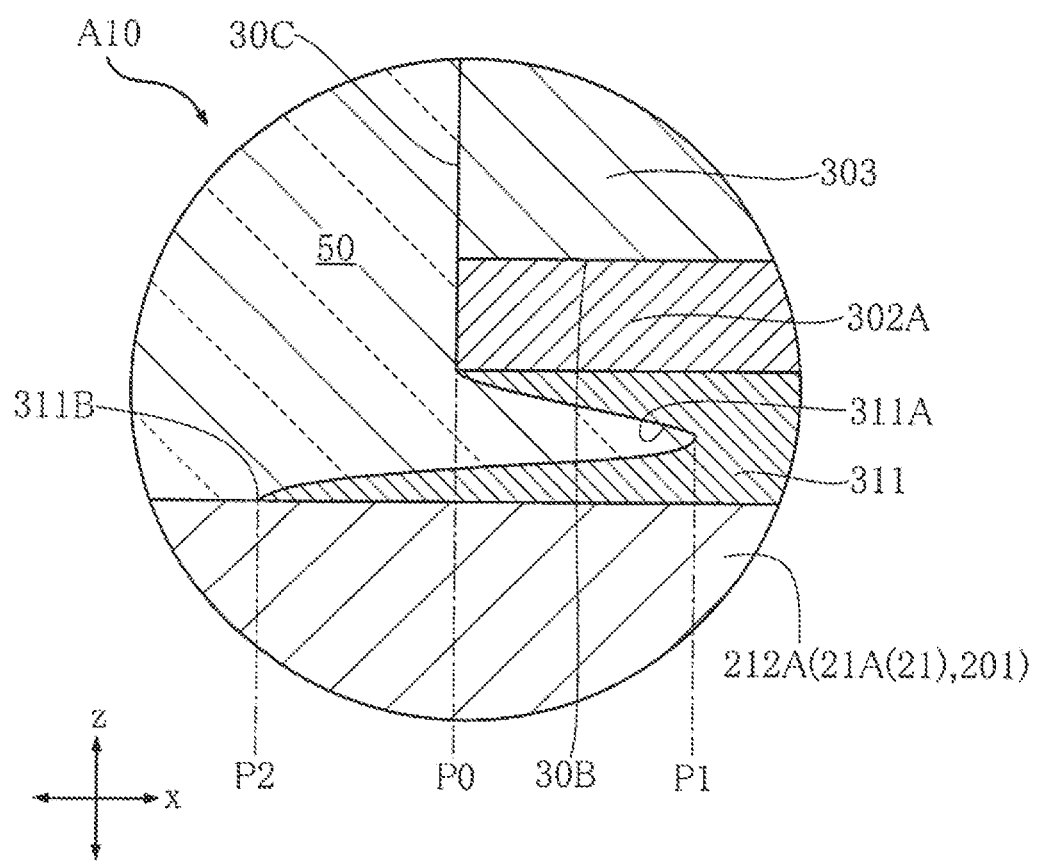
FIG. 8 is a partial enlargement view (near the first bonding layer) of the LED package shown in FIG. 7.
Figure 9:
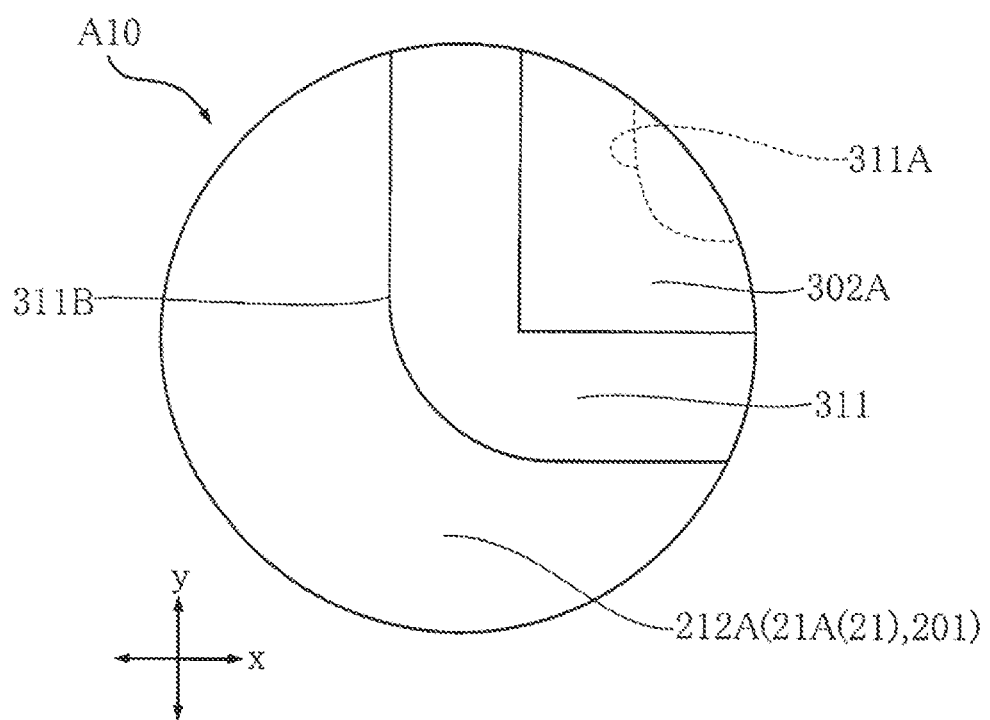
FIG. 9 is a partial enlargement view (near the LED chip) of the LED package shown in FIG. 2.

As illustrated in FIG. 8 and FIG. 9, in the top view, a first bent portion 311A that is recessed toward the inner side of the periphery (i.e., the position P0 in FIG. 8) of the first back electrode 302A (i.e., recessed to the position P1 in FIG. 8) is formed in the first bonding layer 311. It is considered that the first bent portion 311A is formed by the balance of the surface tension when the first joining bonding 311 is melted by reflow. In this embodiment, in the top view, the junction 311B (the position P2 in FIG. 8) between the first terminal 201 (the first connection portion 212A of the first front portion 21A) and the first bonding layer 311 has a section located further outside the periphery of the first back electrode 302A.

FIG. 10 is a partial enlargement sectional view of an LED package A11, which is a first variant of the LED package A10. When being viewed from the top, the periphery (the position P0 in FIG. 10) of the first back electrode 302A in the LED package A11 is located further inside the periphery (the position P3 in FIG. 10) of the back 30B.

Further, FIG. 11 is a partial enlargement sectional view of an LED package A12, which is a second variant of the LED package A10. In the LED package A12, the LED chip 30 comprises a cutting surface 30D that intersects both the back 30B (the position P3 in FIG. 11 is a periphery position thereof) and the sidewalls 30C (the position P4 in FIG. 11 is a periphery position thereof). The cutting surface 30D tilts relative to the back 30B. In the LED chip 30 of this variant, the cutting surface 30D is provided across the entire periphery of the back 30B.

As illustrated in FIG. 2, a FIG. 3, and FIG. 6, the wire 40 is a conductive part that connects the front-side electrode 301 of the LED chip 30 and the second terminal 202 (the second connection portion 212B of the second front portion 21B). The composition of the wire 40 is, for example, Au.

As illustrated in FIG. 1 and FIG. 6, the sealing resin 50 is disposed on the substrate front 11 and covers the LED chip 30 and the wire 40. As illustrated in FIG. 2 and FIG. 6, the sealing resin 50 comprises a pair of outer peripheries 501 that are spaced apart in the first direction x, when being viewed from the top. The outer periphery 501 is in contact with the covering material 51 and has a section that overlaps with the groove 14, when being viewed from the top. The composition of the sealing resin 50 comprises a light-transmissive synthetic resin. The synthetic resin is, for example, an epoxy resin, an epoxy resin containing silicone, or the like. The composition of the sealing resin 50 may comprise a phosphor (not shown). For example, when the LED chip 30 emits blue light, white light is emitted from the LED package A10 by including a yellow phosphor in the sealing resin 50. As shown in FIG. 8, the sealing resin 50 is in contact with the first bent portion 311A formed in the first bonding layer 311.

As illustrated in FIG. 1 to FIG. 6 (except FIG. 3 and FIG. 4), the covering material 51 is an electric-insulating part provided at the substrate front 11, and when being viewed from the top, it overlaps with at least a portion of the groove 14. The covering material 51 is, for example, a solder resist film. In this embodiment, the covering material 51, when being viewed from the top, overlaps with the entirety of the groove 14 and covers the first base portion 211A (the first front portion 21A of the first terminal 201) and the second base portion 211B (the second front portion 21B of the second terminal 202).

Next, a first example of the manufacturing method of the LED chip 30 and the first bonding layer 311 of the LED package A10 will be described with reference to FIGS. 12 to 18. The LED chip 30 and the first bonding layer 311 manufactured according to this example are directed to the one shown in FIG. 7.

Figure 12:
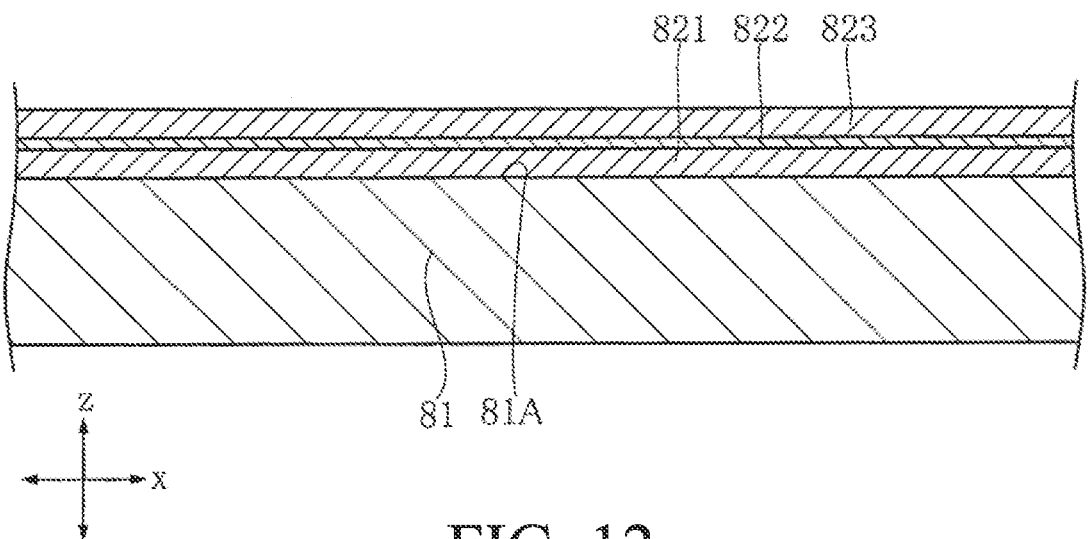
FIG. 12 is a sectional view illustrating a first example for manufacturing the LED chip and the first bonding layer of the LED package shown in FIG. 1.

First, as illustrated in FIG. 12, after preparing the substrate 81 having the front 81A facing in the thickness direction z, the n-type semiconductor layer 821, the active layer 822, and the p-type semiconductor layer 823 are sequentially formed in said order on the front 81A by epitaxial growth. The substrate 81 corresponds to the substrate 303 of the LED chip 30. In the present embodiment, the substrate 81 is a wafer made of GaAs. Further, the n-type semiconductor layer 821, the active layer 822, and the p-type semiconductor layer 823 correspond to the n-type semiconductor layer 305, the active layer 306, and the p-type semiconductor layer 304 of the LED chip 30, respectively.

Figure 13:
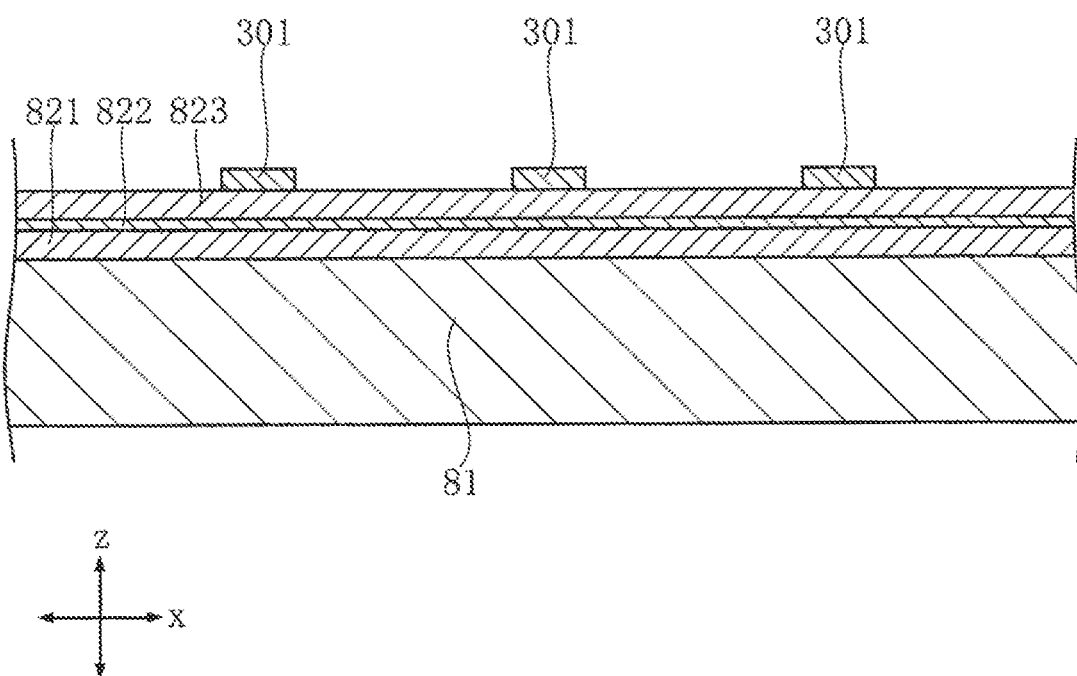
FIG. 13 is a sectional view illustrating a first example for manufacturing the LED chip and the first bonding layer of the LED package shown in FIG. 1.

Then, as illustrated in FIG. 13, a plurality of front-side electrodes 301 are formed in a portion of the p-type semiconductor layer 823. The plurality of front-side electrodes 301 are formed by vacuum evaporation after forming a mask by photolithography. After forming the plurality of front-side electrodes 301, the mask and the extra metal layer attached to the mask are removed.

Figure 14:
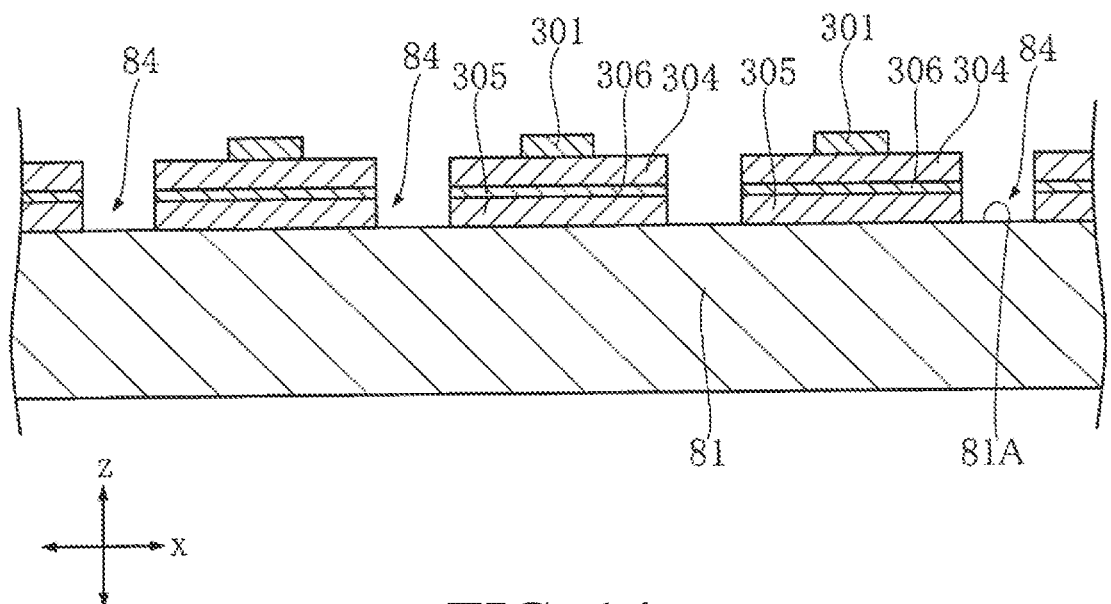
FIG. 14 is a sectional view illustrating a first example for manufacturing the LED chip and the first bonding layer of the LED package shown in FIG. 1.

Next, as illustrated in FIG. 14, a respective part of each of the n-type semiconductor layer 821, the active layer 822, and the p-type semiconductor layer 823 is removed in a grid pattern by dry etching. Through this step, a plurality of p-type semiconductor layers 304, n-type semiconductor layers 305, and active layers 306 projecting in a mesa shape from the front 81A are formed corresponding to the front-side electrodes 301. In addition, a respective portion of each of the n-type semiconductor layer 821, the active layer 822, and the p-type semiconductor layer 823 removed in this step exists as a lattice-like groove 84.

Figure 15:
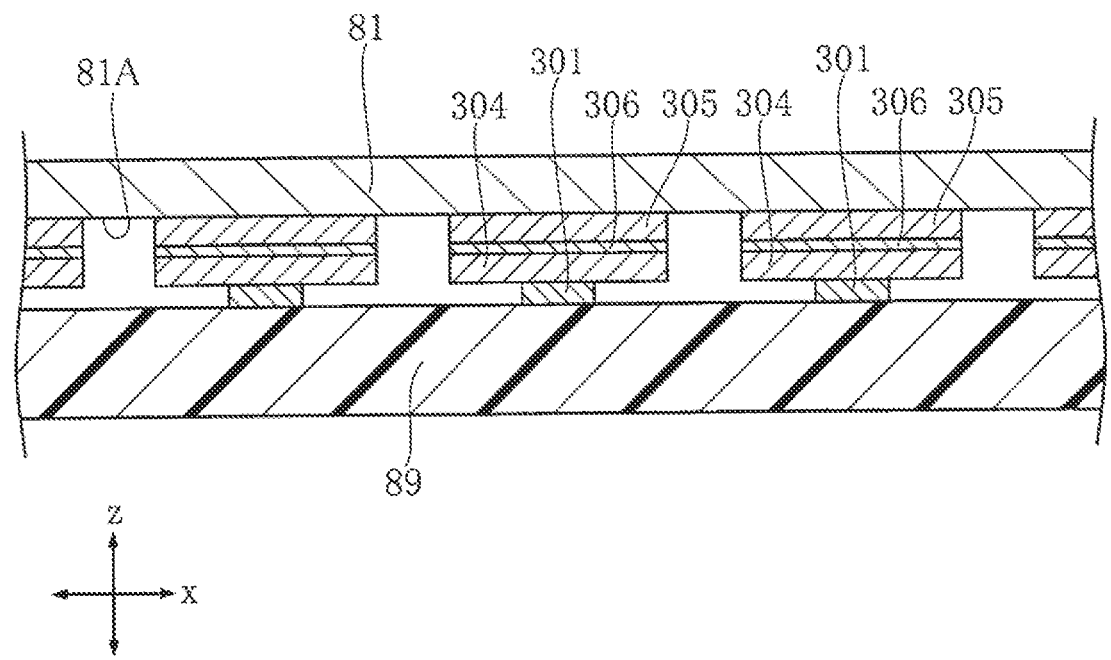
FIG. 15 is a sectional view illustrating a first example for manufacturing the LED chip and the first bonding layer of the LED package shown in FIG. 1.

Thereafter, as illustrated in FIG. 15, after attaching the sheet 89 to the plurality of front-side electrodes 301, the substrate 81 is flipped, and a portion of the substrate 81 that is located at the surface opposite to the front 81A in the thickness direction z is removed by wet-etching.

Figure 16:
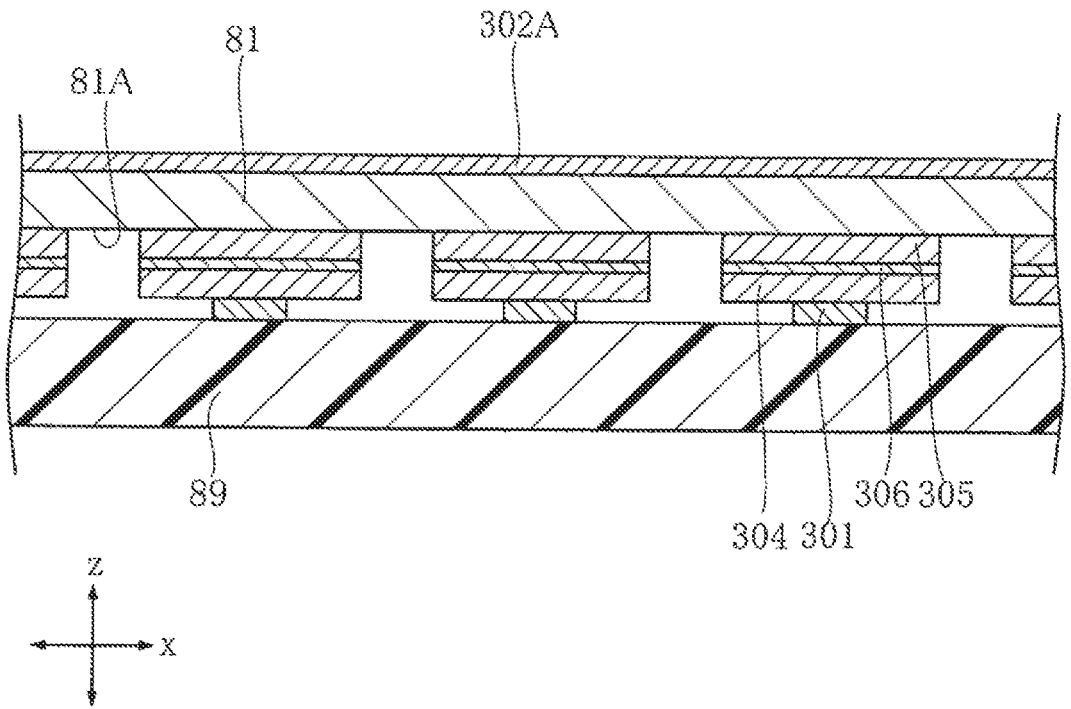
FIG. 16 is a sectional view illustrating a first example for manufacturing the LED chip and the first bonding layer of the LED package shown in FIG. 1.

Then, as illustrated in FIG. 16, the first back electrode 302A is formed on the entire surface of the substrate 81 facing the opposite orientation of the front 81A in the thickness direction z by vacuum evaporation.

Figure 17:
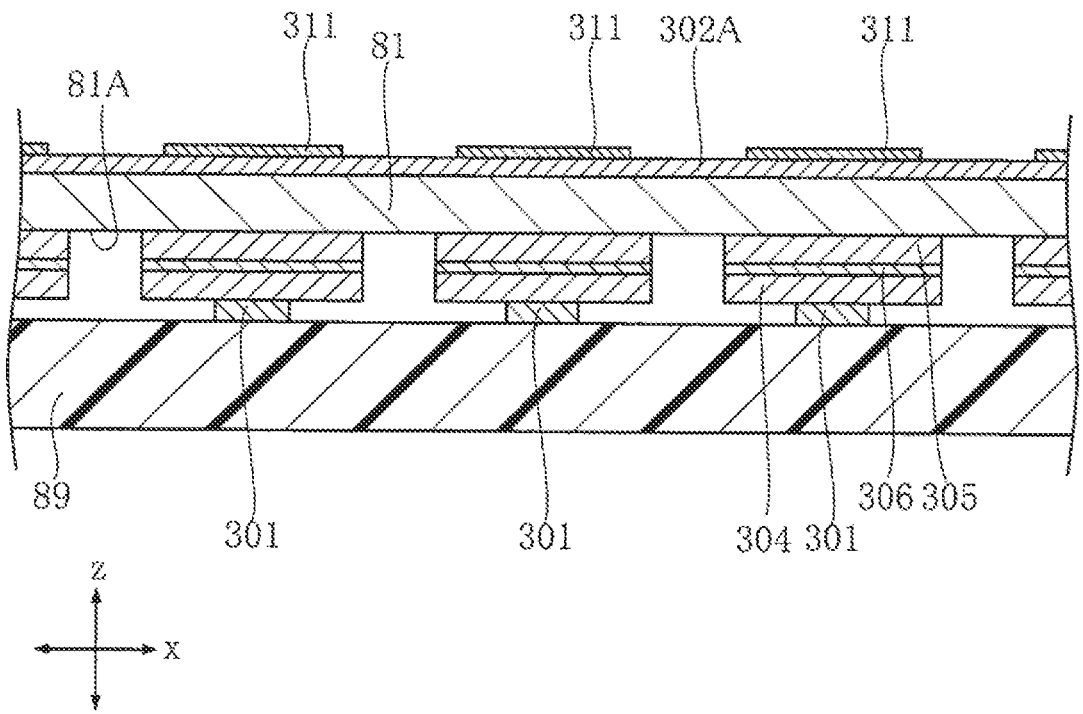
FIG. 17 is a sectional view illustrating a first example for manufacturing the LED chip and the first bonding layer of the LED package shown in FIG. 1.

Next, as illustrated in FIG. 17, a plurality of first bonding layers 311 are formed at the first back electrode 302A. The plurality of first bonding layers 311 are formed by vacuum evaporation after forming a mask by photolithography. After forming the plurality of first bonding layer 311, the mask and the extra metal layer attached to the mask are removed.

Figure 18:
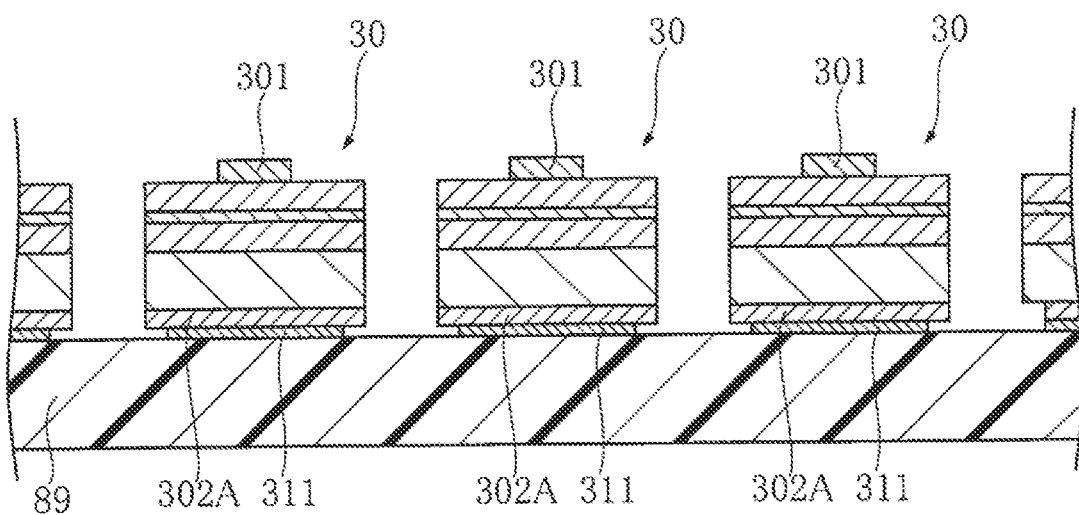
FIG. 18 is a sectional view illustrating a first example for manufacturing the LED chip and the first bonding layer of the LED package shown in FIG. 1.

Last, as illustrated in FIG. 18, attaching the sheet 89 to the plurality of first bonding layers 311. Thereafter, the substrate 81 is flipped once again, and after removing the sheet 89 from the plurality of front-side electrodes 301, the substrate 81 and the first back electrode 302A are divided into individual pieces by dicing. In this step, the diced pieces become the LED chip 30 and the first bonding layer 311. The LED chip 30 and first bonding layer 311 of the LED package A10 are manufactured through the above-mentioned steps.

Next, a second example of the manufacturing method of the LED chip 30 and the first bonding layer 311 of the LED package A10 will be described with reference to FIGS. 19 to 25.

Figure 19:
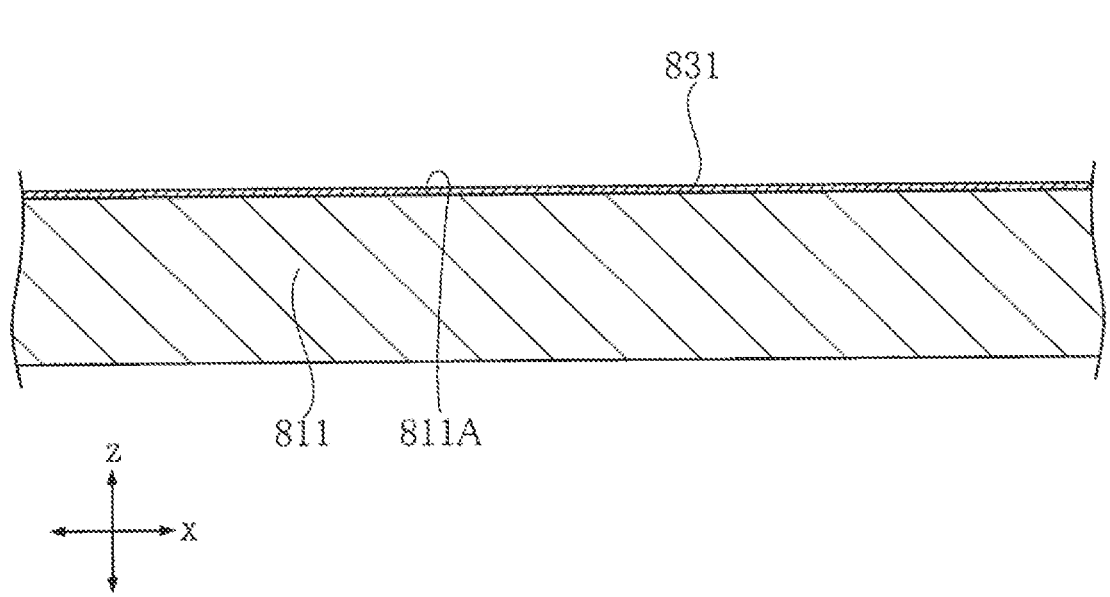
FIG. 19 is a sectional view illustrating a second example for manufacturing the LED chip and the first bonding layer of the LED package shown in FIG. 1.

First, as illustrated in FIG. 19, after preparing a first substrate 811 having a front 811A facing in the thickness direction z, a first reflective layer 831 is formed on the front 811A. In the present embodiment, the substrate 811 is a silicon-based wafer, and the composition of the first reflective layer 831 is Au. Further, the first reflective layer 831 is formed by vacuum evaporation. The first substrate 811 corresponds to the substrate 303 of the LED chip 30.

Figure 20:
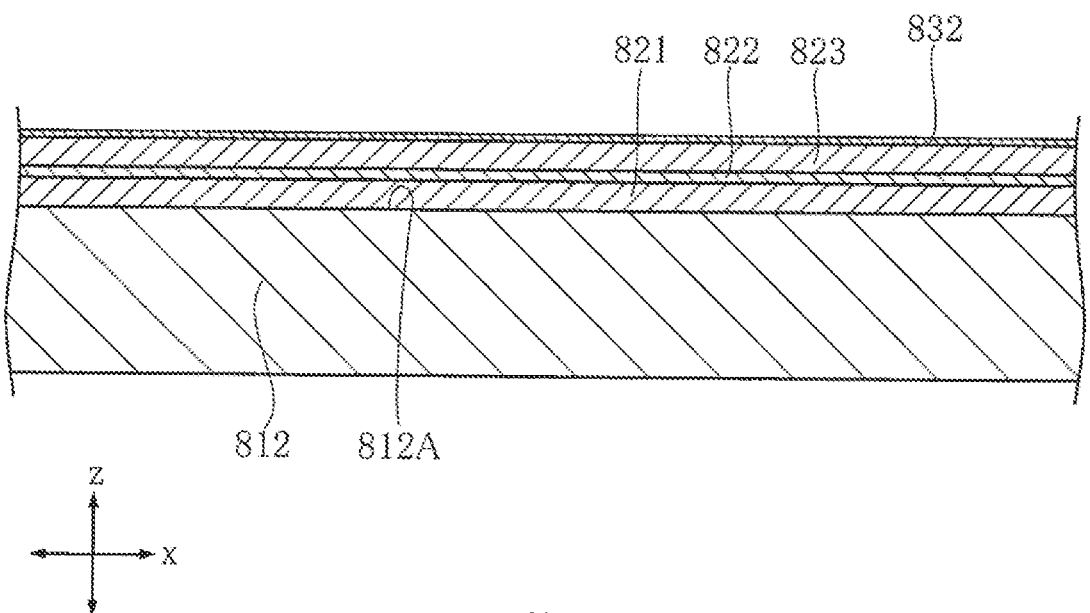
FIG. 20 is a sectional view illustrating a second example for manufacturing the LED chip and the first bonding layer of the LED package shown in FIG. 1.

Next, as illustrated in FIG. 20, after preparing a second substrate 812 having a front 812A facing the thickness direction z, the n-type semiconductor layer 821, the active layer 822, the p-type semiconductor layer 823, and a second reflective layer 832 are sequentially formed in said order on the front 812A by epitaxial growth. In the present embodiment, the second substrate 812 is a wafer made of GaAs. Further, the n-type semiconductor layer 821, the active layer 822, and the p-type semiconductor layer 823 correspond to the n-type semiconductor layer 305, the active layer 306, and the p-type semiconductor layer 304 of the LED chip 30, respectively. The composition of the second reflective layer 832 is Au. The second reflective layer 832 is formed in contact with the p-type semiconductor layer 823 by vacuum evaporation.

Figure 21:
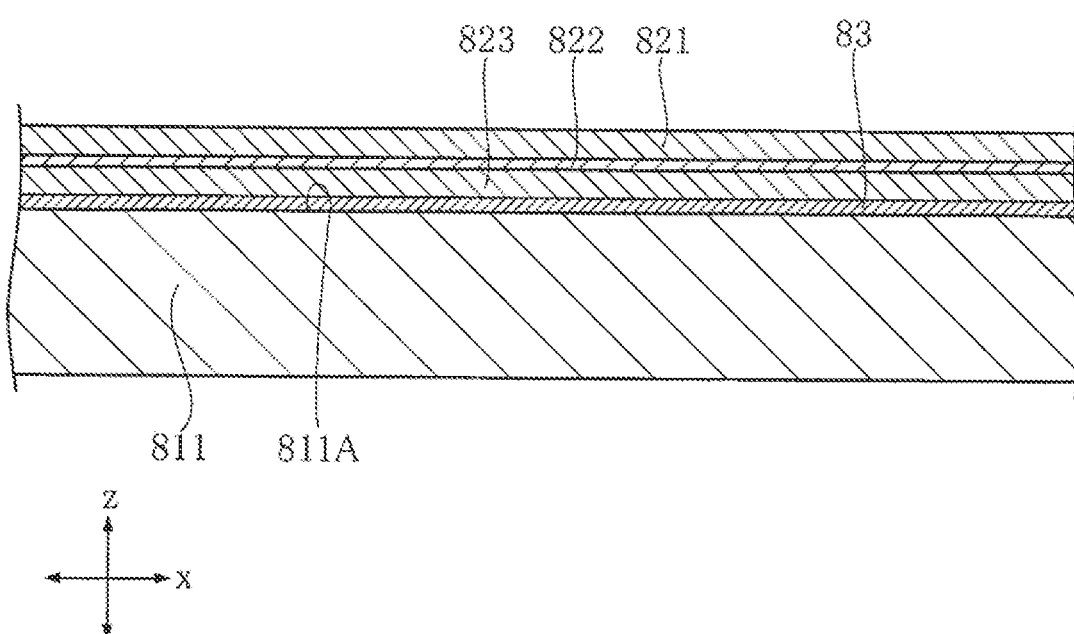
FIG. 21 is a sectional view illustrating a second example for manufacturing the LED chip and the first bonding layer of the LED package shown in FIG. 1.

Next, as illustrated in FIG. 21, after bonding the second substrate 812 prepared using the step as shown in FIG. 20 with the first substrate 811 prepared using the step as shown in FIG. 19, the second substrate 812 is removed. The first substrate 811 and the second substrate 812 are bonded by bringing the second reflection layer 832 into contact with the first reflection layer 831 and then heat treating the first reflection layer 831 and the second reflection under inert gas to form an alloy. At this time, a reflective layer 83 made of an alloy of the first reflective layer 831 and the second reflective layer 832 is obtained. Removal of the second substrate 812 is performed by wet etching.

Figure 22:
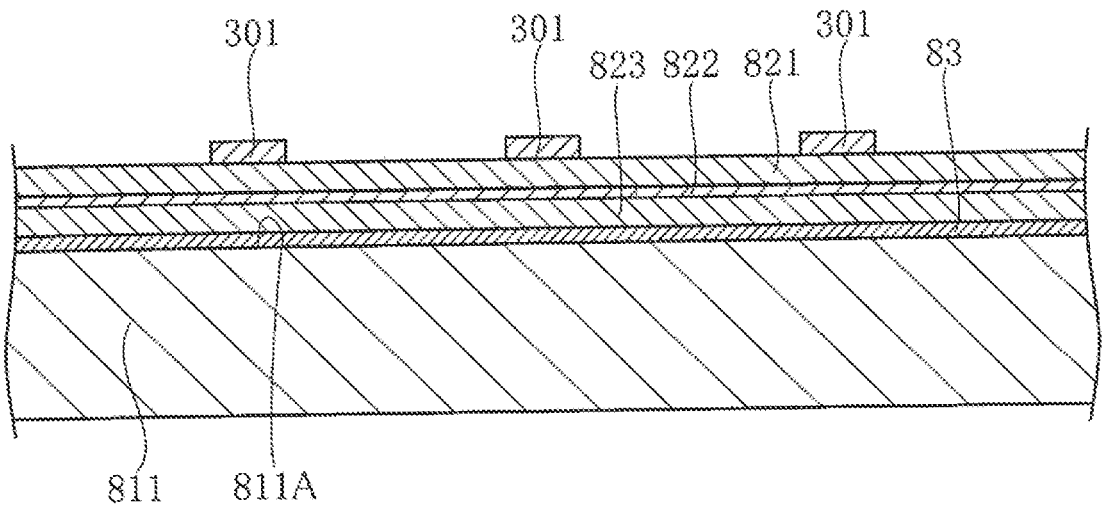
FIG. 22 is a sectional view illustrating a second example for manufacturing the LED chip and the first bonding layer of the LED package shown in FIG. 1.

Then, as illustrated in FIG. 22, a plurality of front-side electrodes 301 in contact with the n-type semiconductor layer 821 are formed. Similar to FIG. 13, the plurality of surface electrodes 301 are formed by vacuum evaporation after forming a mask on the n-type semiconductor layer 821 by photolithography.

Figure 23:
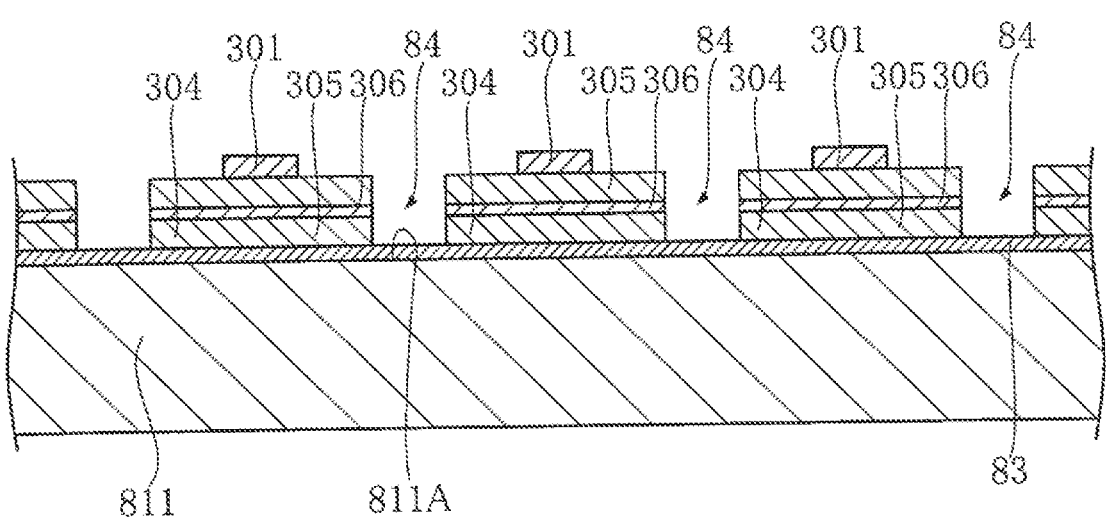
FIG. 23 is a sectional view illustrating a second example for manufacturing the LED chip and the first bonding layer of the LED package shown in FIG. 1.

Thereafter, as illustrated in FIG. 23, a respective part of each of the n-type semiconductor layer 821, the active layer 822, and the p-type semiconductor layer 823 is removed in a grid pattern by dry etching or wet etching. Through this step, a plurality of p-type semiconductor layers 304, n-type semiconductor layers 305, and active layers 306 projecting in a mesa shape from the reflective layer 83 are formed corresponding to the front-side electrodes 301. In addition, a portion of the n-type semiconductor layer 821, a portion of the active layer 822, and a portion of the p-type semiconductor layer 823 removed in this step appear as a lattice-like groove 84.

Figure 24:
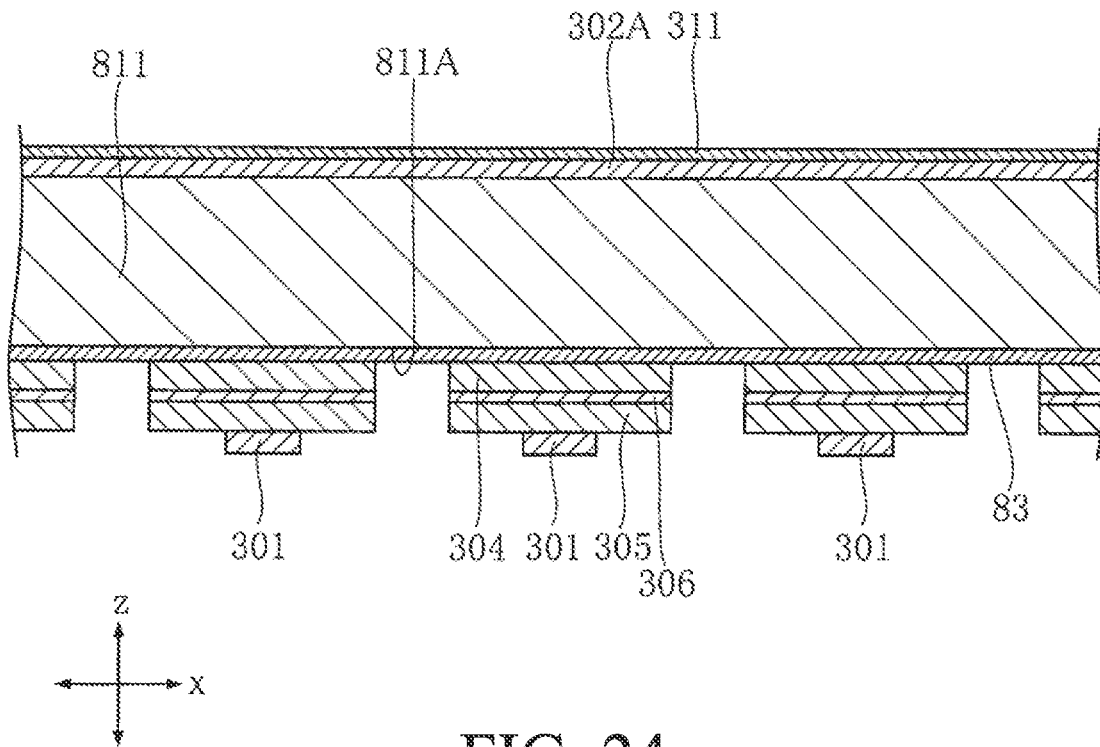
FIG. 24 is a sectional view illustrating a second example for manufacturing the LED chip and the first bonding layer of the LED package shown in FIG. 1.

Next, as illustrated in FIG. 24, after flipping the substrate 81, a first back electrode 302A covering the entire surface of the first substrate 811 facing away from the front 811A, and a first bonding layer 311 covering the first back electrode 302A are formed. The first back electrode 302A and the first bonding layer 311 are sequentially formed by vacuum evaporation.

Figure 25:
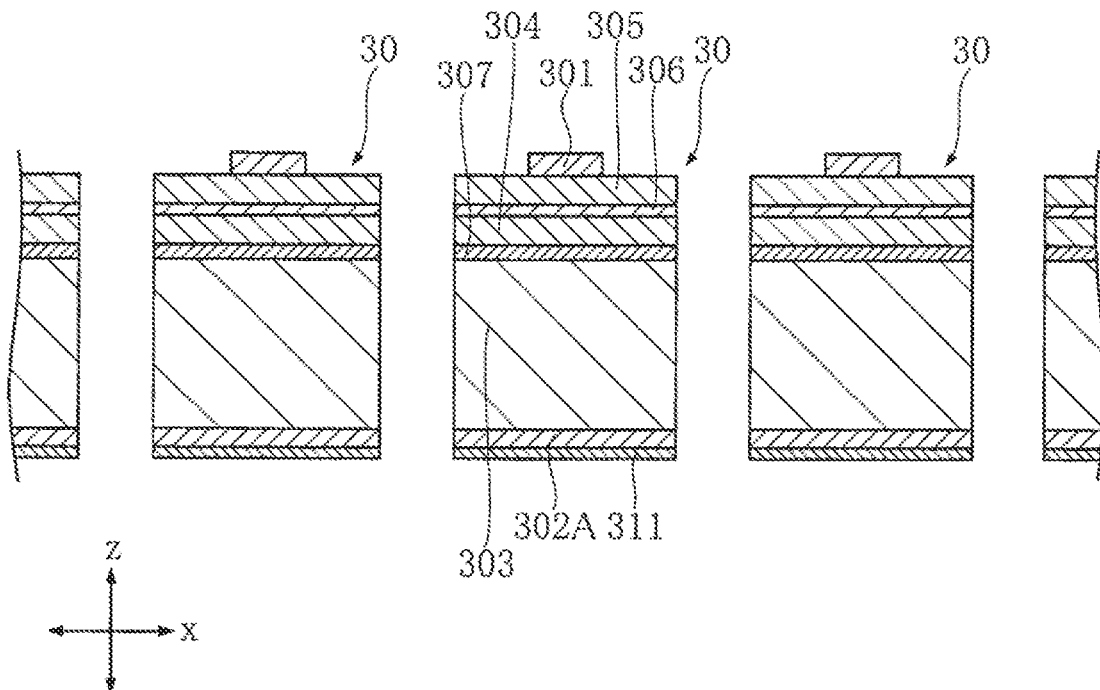
FIG. 25 is a sectional view illustrating a second example for manufacturing the LED chip and the first bonding layer of the LED package shown in FIG. 1.

Last, as illustrated in FIG. 25, after flipping the substrate 81 once again, the reflective layer 83, the first substrate 811, the first back electrode 302A, and the first bonding layer 311 are divided into individual pieces by dicing. During the dicing, each individual piece surrounds the front-side electrode 301. The individual piece divided in this step becomes the LED chip 30 and the first bonding layer 311. Through the above steps, the LED chip 30 and the first bonding layer 311 in the LED package A10 are manufactured. The composition of the substrate 303 of the LED chip 30 obtained by this manufacturing method is Si. In addition, the LED chip 30 obtained by this manufacturing method has a reflective layer 307 between the substrate 303 and the p-type semiconductor layer 304. The reflective layer 307 is a part of the reflective layer 83 obtained by the process shown in FIG. 21. The composition of the reflective layer 307 is Au. The reflective layer 307 exhibits the following function: reflecting the light emitted from the active layer 306, thereby increasing the light flux emitted from the LED chip 30.

Next, the functions and effects of the LED package A10 are described.

The LED package A10 comprises the first bonding layer 311 that bonds the first back electrode 302A of the LED chip 30 with the first terminal 201. The composition of the first bonding layer 311 is a metal eutectic composition comprising Au. By adopting such composition, the moisture absorption of the first bonding layer 311 is prevented, so that it is possible to avoid a reduction in power supply efficiency to the LED chip 30. In addition, the first bonding layer 311 has a higher bonding strength and higher electrical conductivity than the Ag paste. Therefore, the LED chip 30 of higher output type can be applied. In addition, in the top view, first bent portion 311A recessed inwardly from the periphery of the first back surface electrode 302A is formed at the first bonding layer 311. Here, the thermal stress caused by heat generated from the LED chip 30 is applied repeatedly to the in the first bonding layer 311. The higher the output of the LED chip 30, the greater the thermal stress. Therefore, by adopting such configuration, the thermal stress is concentrated at the inner peripheral of the first bent portion 311A with a greater thickness in the plan view, and the thermal stress takes place between the first terminal 201 and the first joining layer 311 in the plan view is alleviated. In this way, the cracks formed at the junction 311B due to the thermal stress can be inhibited, and the decrease in the current flowing into the first bonding layer 311 is prevented. Therefore, according to the LED package A10, it is possible to ensure the reliability of the LED package A10 during use while at the same time adopting the LED chip 30 of a higher power output.

The composition of the first bonding layer 311 comprises Au and Sn. By adopting such composition, the melting point of the first bonding layer 311 is lowered. However, the melting point of the first bonding layer 311 is set to be higher than the melting point of the solder. Hence, when mounting the LED package A10 by reflowing, it is feasible to prevent the melting of the first bonding layer 311. Moreover, even when the composition of the first bonding layer 311 includes Au and In, it is possible to lower the melting point of the first bonding layer 311 while keeping it higher than the melting point of the solder.

In the LED package A10, the junction 311B between the first terminal 201 (the first connection portion 212 A of the first front portion 21 A) and the first bonding layer 311 is located further outside the periphery of the first back electrode 302A, when being viewed from the top. By adopting such configuration, it is feasible to ensure that the area of the first bonding layer 311 in contact with the first terminal 201 is larger, and hence, the heat generated from the LED chip 30 can be more efficiently released to the outside of the LED package A10.

In the LED package A11, which is the first variant of the LED package A10, the periphery of the first back electrode 302A is located inside the peripheral of the back 30B in the top view. By adopting such configuration, when manufacturing the LED package A10, the occurrence of metal burrs at the periphery of the first back electrode 302A can be avoided when making the LED chip 30 into individual pieces. Thus, when the LED chip 30 is mounted on the first terminal 201 (the first connection portion 212A of the first front portion 21A) by die bonding, it is feasible to prevent the LED chip 30 from becoming unstable with respect to the first terminal 201.

In the LED package A10, the sealing resin 50 is in contact with the first bent portion 311A formed at the first bonding layer 311. By adopting such configuration, even when the first bonding layer 311 undergoes the thermal expansion due to the heat generated by the LED chip 30, the sealing resin 50 in contact with the first bent portion 311A would follow the strain of the first bonding layer 311. Therefore, the strain of the sealing resin 50 in the vicinity of the substrate front 11 is reduced, and it is feasible to avoid the peeling of the sealing resin 50 from the substrate front 11.

Further, in the LED package A12, which is a second variant to the LED package A10, the LED chip 30 has a cutting surface 30D that intersects the back 30B. The cutting surface 30D tilts relative to the back 30B. By adopting such configuration, it is more likely that the sealing resin 50 wraps around to the first bent portion 311A formed at the first bonding layer 311. Therefore, the strain of the sealing resin 50 in the vicinity of the above-described substrate front 11 is further reduced, and it is feasible to prevent the peeling of the sealing resin 50 from the substrate front 11 more effectively. Further, by adopting such configuration, the occurrence of metal burrs at the periphery of the first back electrode 302A can be avoided when making the LED chip 30 into individual pieces.

Second Embodiment

Figure 26:
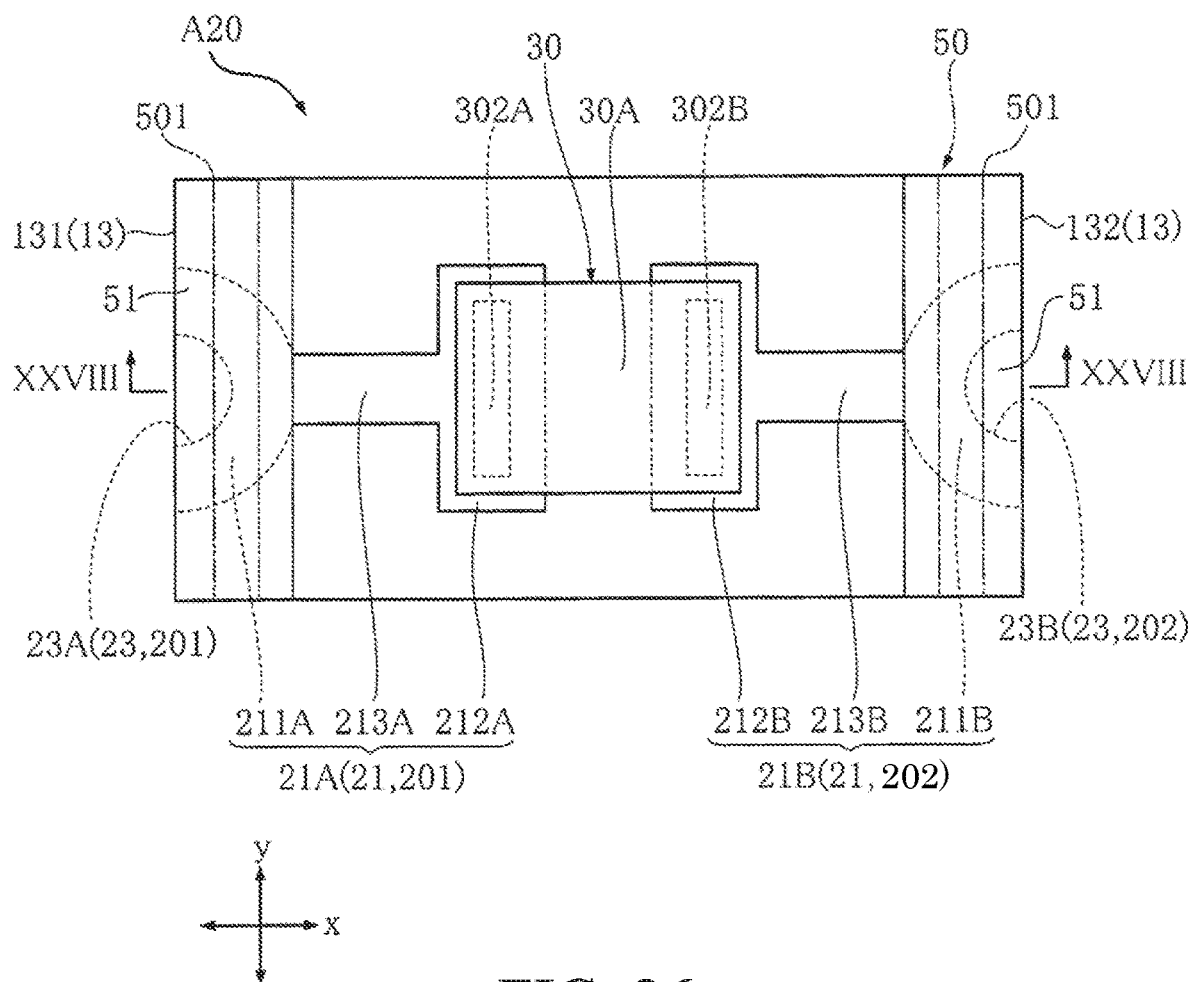
FIG. 26 is a top view of a semiconductor device (through the sealing resin) according to the second embodiment of the present invention.
Figure 27:
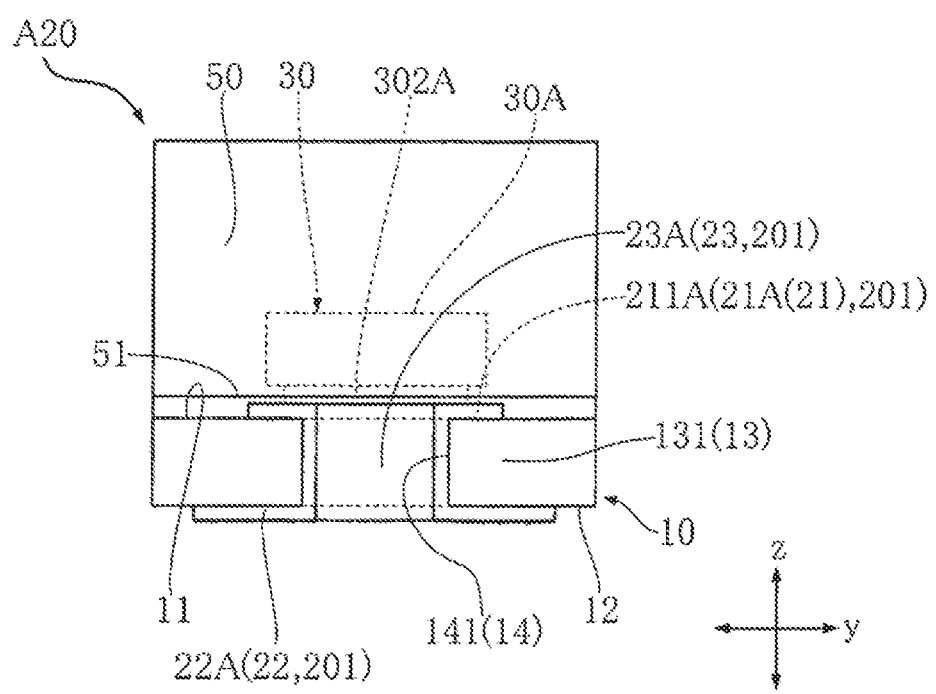
FIG. 27 is a left side view of the LED package shown in FIG. 26.
Figure 29:
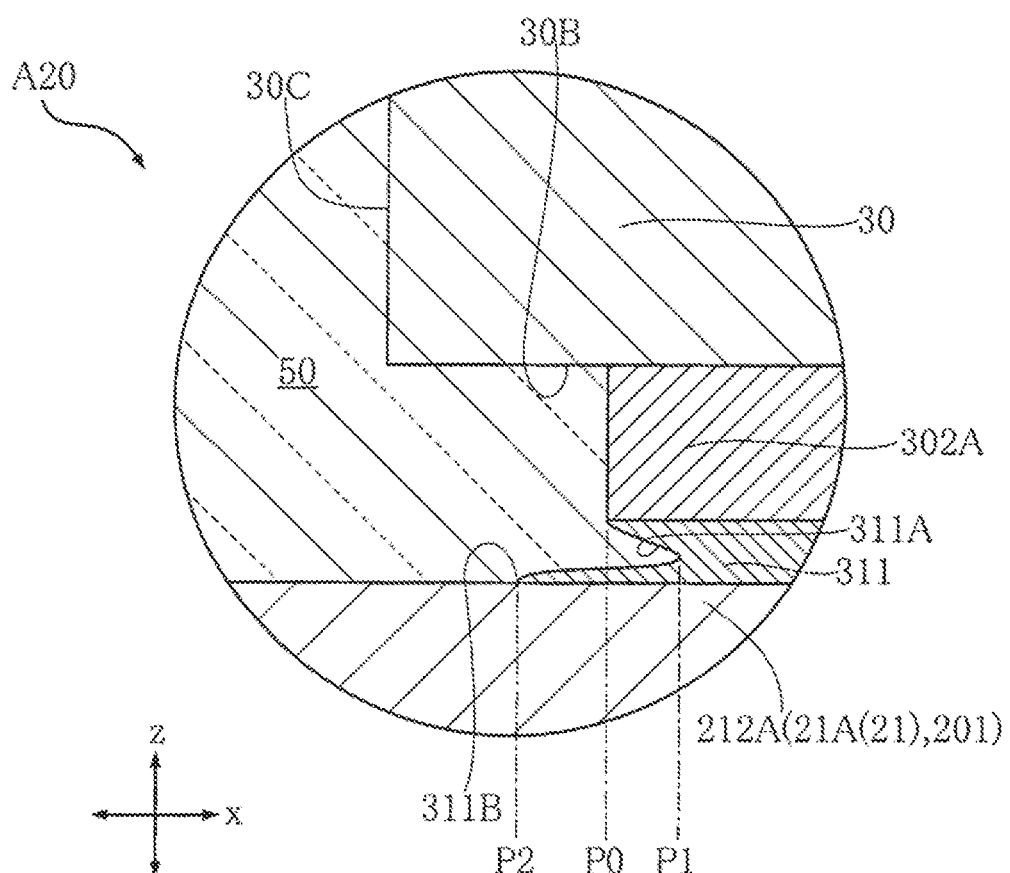
FIG. 29 is a partial enlargement view (near the first bonding layer) of the LED package shown in FIG. 28.
Figure 30:
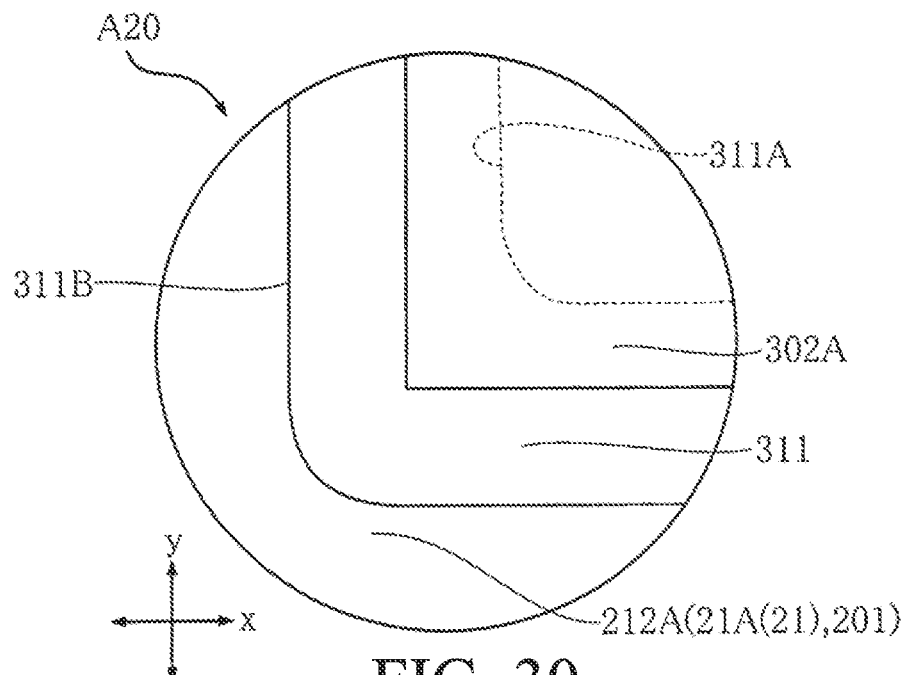
FIG. 30 is a partial enlargement view (near the first back electrode) of the LED package shown in FIG. 26.

The LED package A20 according to the second embodiment of the present invention is discussed with reference to FIG. 26 to FIG. 32. In these drawings, the elements that are the same as or similar to those of the above-described LED package A10 are denoted by the same or similar reference numerals, and repetitive description related to these elements are omitted. Here, FIG. 26 is illustrated through the sealing resin 50 to facilitate the understanding of the present embodiment, and the outline of the sealing resin 50 that has been passed through is indicated by the dashed line. To facilitate the understanding, the components of the LED chip 30 other than the first back electrode 302A and the second back electrode 302B are shown in FIG. 30 and FIG. 32.

In the LED package A20, the configuration of the first front portion 21A of the first terminal 201 and the second front portion 21B of the second terminal 202, the structure type of the LED chip 30, the first bonding layer 311, and the second bonding layer 312 are different from those in the LED package A10 described above. Like the LED package A10, the LED package A20 is a surface-mount type in which the first terminal 201 and the second terminal 202 are both supported by the substrate 10. In the LED package A20, the wire 40 is omitted.

Figure 28:
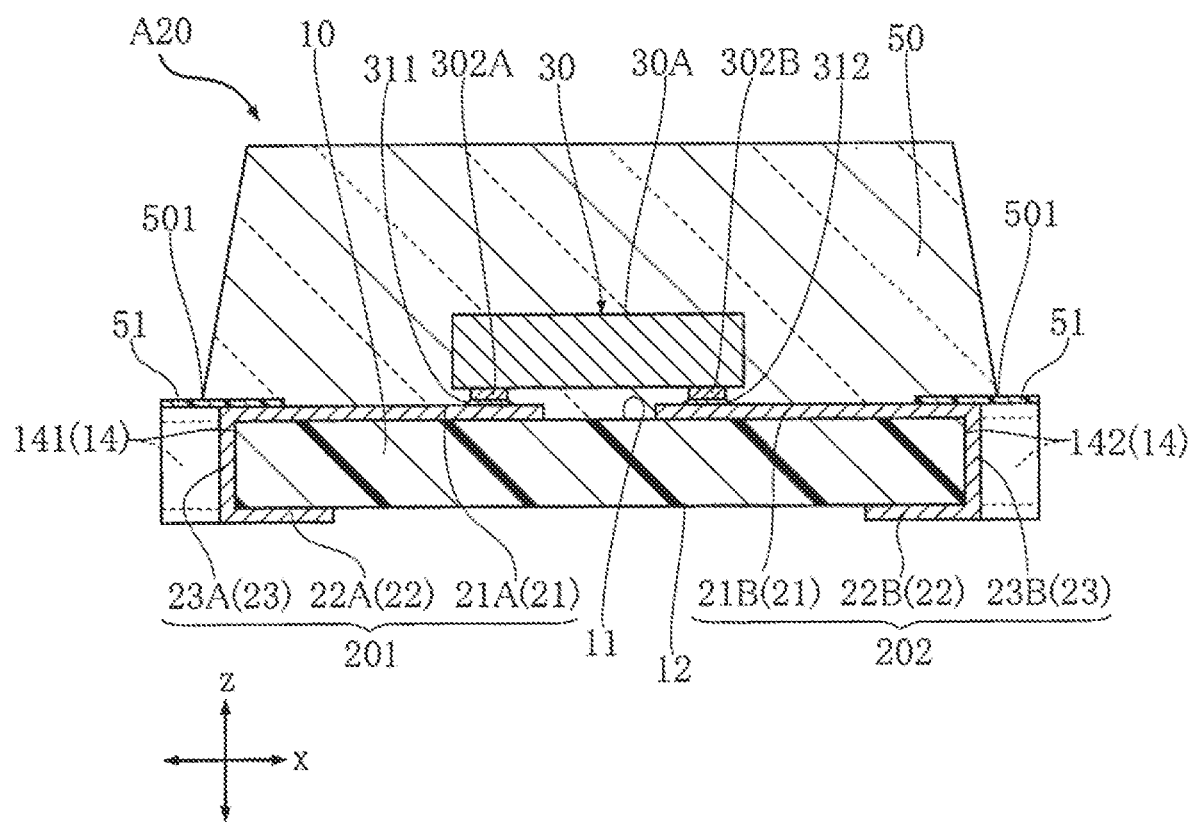
FIG. 28 is a sectional view taken along the line XXVIII-XXVIII in FIG. 26.

In this embodiment, as illustrated in FIG. 26 and FIG. 28, the LED chip 30 is mounted on both the first front portion 21A of the first terminal 201 and the second front portion 21B of the second terminal 202. The composition of the first terminal 201 and the second terminal 202 according to this embodiment is the same as the composition of the first terminal 201 and the second terminal 202 of the LED package A10.

As illustrated in FIG. 26, the first front portion 21A of the first terminal 201 comprises a first base portion 211A, a first connection portion 212A, and a first coupling portion 213A. The configuration of the first base portion 211A according to the present embodiment is the same as the configuration of the first base portion 211A of the LED package A10. The first back electrode 302A of the LED chip 30 is connected at the first connection portion 212A via the first bonding layer 311. Accordingly, the first terminal 201 and first back electrode 302A are conducted. In the top view, the periphery of the first connection portion 212A is located further outside the periphery of the first back electrode 302A. The first coupling portion 213A connects the first base portion 211A and the first connection portion 212A. In the top view, the first coupling portion 213A is a strip extending in the first direction x.

As illustrated in FIG. 26, the second front portion 21B of the second terminal 202 comprises a second base portion 211B, a second connection portion 212B, and a second coupling portion 213B. The configuration of the second base portion 211B according to the present embodiment is the same as the configuration of the second base portion 211B of the LED package A10. The second back electrode 302B (see detailed discussion below) of the LED chip 30 is connected at the second connection portion 212B via the second bonding layer 312 (see detailed discussion below). Accordingly, the second terminal 202 and second back electrode 302B are conducted. In the top view, the periphery of the second connection portion 212B is located further outside the periphery of the second back electrode 302B. The second coupling portion 213B connects the second base portion 211B and the second connection portion 212B. In the top view, the second coupling portion 213B is a strip extending in the first direction x.

As illustrated in FIG. 28, the LED chip 30 comprises a first back electrode 302A and a second back electrode 302B, and omits the front-side electrode 301.

The first back electrode 302A and the second back electrode 302B are both disposed at the back 30B of the LED chip 30. The second back electrode 302B is spaced apart from the first back electrode 302A in the first direction x. The first back electrode 302A corresponds to the p-side electrode (anode) of the LED chip 30. The second back electrode 302B corresponds to the n-side electrode (cathode) of the LED chip 30. Therefore, the LED chip 30 of the present embodiment is a so-called "flip chip". Further, like the LED package A10, the LED chip 30 is bonded to the first terminal 201 and the second terminal 202 by reflowing.

The composition and manufacturing process of the first bonding layer 311 according to the present embodiment are the same as that of the first bonding layer 311 of the above-mentioned LED package A10. As illustrated in FIG. 29 and FIG. 30, in this embodiment, and also in the top view, a first bent portion 311A that is recessed toward the inner side of the periphery (i.e., the position P0 in FIG. 29) of the first back electrode 302A (i.e., recessed to the position P1 in FIG. 29) is formed in the first bonding layer 311. Further, in the top view, the junction 311B (the position P2 in FIG. 29) between the first terminal 201 (the first connection portion 212A of the first front portion 21A) and the first bonding layer 311 has a section located further outside the periphery of the first back electrode 302A.

Figure 31:
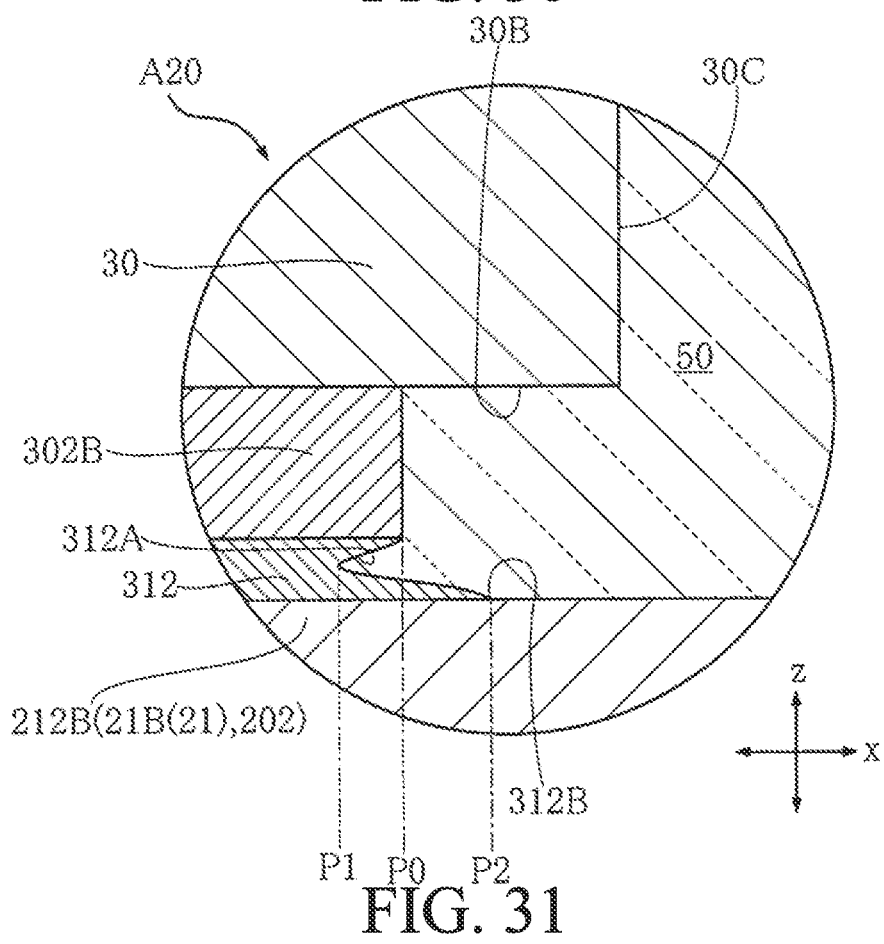
FIG. 31 is a partial enlargement view (near the second bonding layer) of the LED package shown in FIG. 28.
Figure 32:
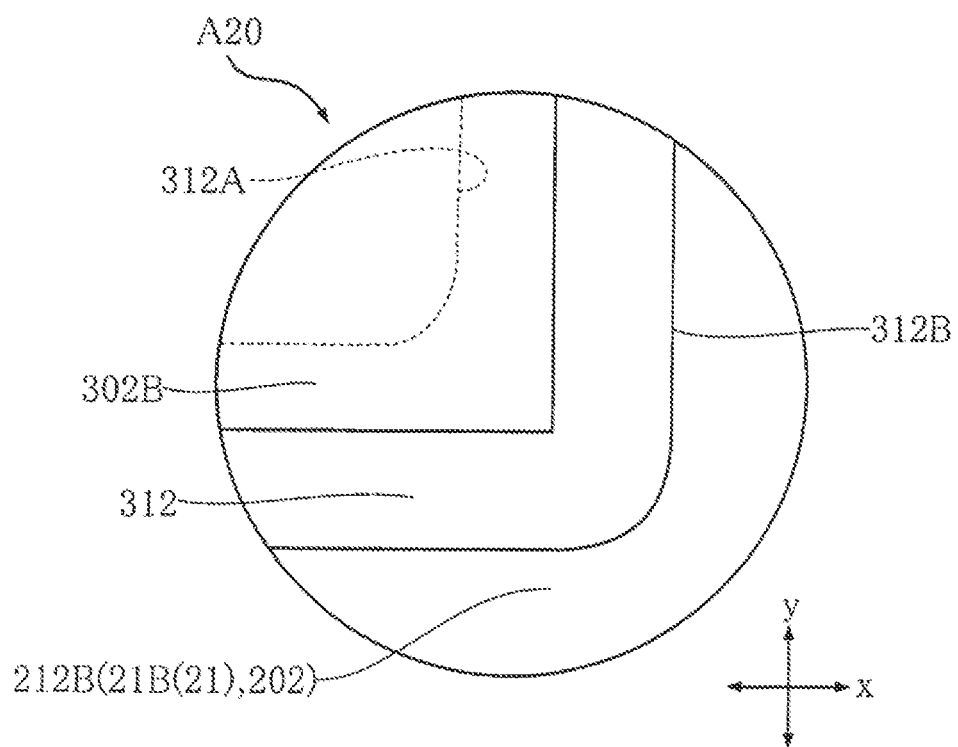
FIG. 32 is a partial enlargement view (near the second back electrode) of the LED package shown in FIG. 26.

As illustrated in FIG. 31, the second bonding layer 312 is a conductive part that connects the second back electrode 302B and the second terminal 202 (the second connection portion 212B of the second front portion 21B). The composition and manufacturing process of the second bonding layer 312 according to the present embodiment are the same as that of the first bonding layer 311 of the present embodiment. As illustrated in FIG. 31 and FIG. 32, in the top view, a second bent portion 312A that is recessed toward the inner side of the periphery (i.e., the position P0 in FIG. 31) of the second back electrode 302B (i.e., recessed to the position P1 in FIG. 29) is formed in the second bonding layer 312. The sealing resin 50 is in contact with the second bent portion 312A. The mechanism used to form the second bent portion 312A is the same as those described above in connection with the manufacturing of the first bent portion 311A of the first bonding layer 311 of the LED package A10. Further, in the top view, the junction 312B (the position P2 in FIG. 31) between the second terminal 202 and the second bonding layer 312 has a section located further outside the periphery of the second back electrode 302B.

Next, the functions and effects of the LED package A20 are described.

In addition to having a first bonding layer 311 having the same configuration with that of the LED package A10, the present LED package A20 also comprises a second bonding layer 312 having the same composition with that of the first bonding layer 311. Therefore, the moisture absorption of the first bonding layer 311 and the second bonding layer 312 is prevented, so that it is possible to avoid a reduction in power supply efficiency to the LED chip 30 and to adopt the LED chip 30 of higher output. Further, in the top view, a second bent portion 312A recessed toward the inner periphery of the second back electrode 302B is formed at the second bonding layer 312. Therefore, the cracking of both the first bonding layer 311 and the second bonding layer 312 caused by the thermal strain generated by the LED chip 30 can be prevented. Therefore, according to the LED package A20, it is also possible to ensure the reliability of the LED package A20 during use while at the same time adopting the LED chip 30 of a higher power output.

The LED chip 30 of the present embodiment is the so-called "flip chip," and hence, the wire 40 is omitted from the LED package A20. In this way, there is no need for the space for disposing the wire 40, and therefore, when the LED package A20 is set to have the same size as the LED package A10, it is feasible to adopt a bigger LED chip 30, for the purpose of, such as, increasing the luminance. Alternatively, it the present LED chip 30 is set to have the same size as the LED chip 30 of the LED package A10, then the size of the LED package A20 may be more compact.

Third Embodiment

Figure 33:
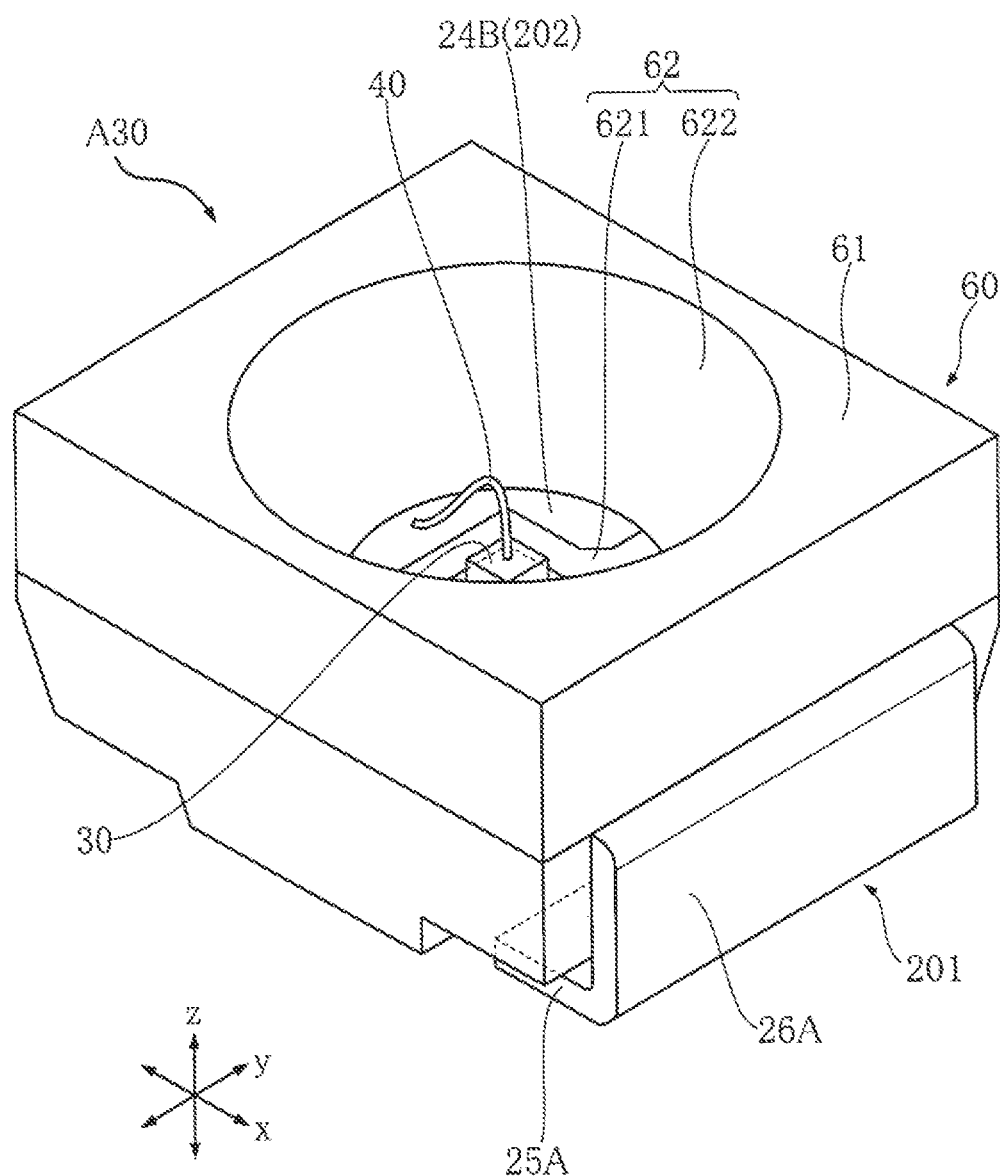
FIG. 33 is a stereogram (through the sealing resin) of the LED package according to the third embodiment of the present invention.
Figure 34:
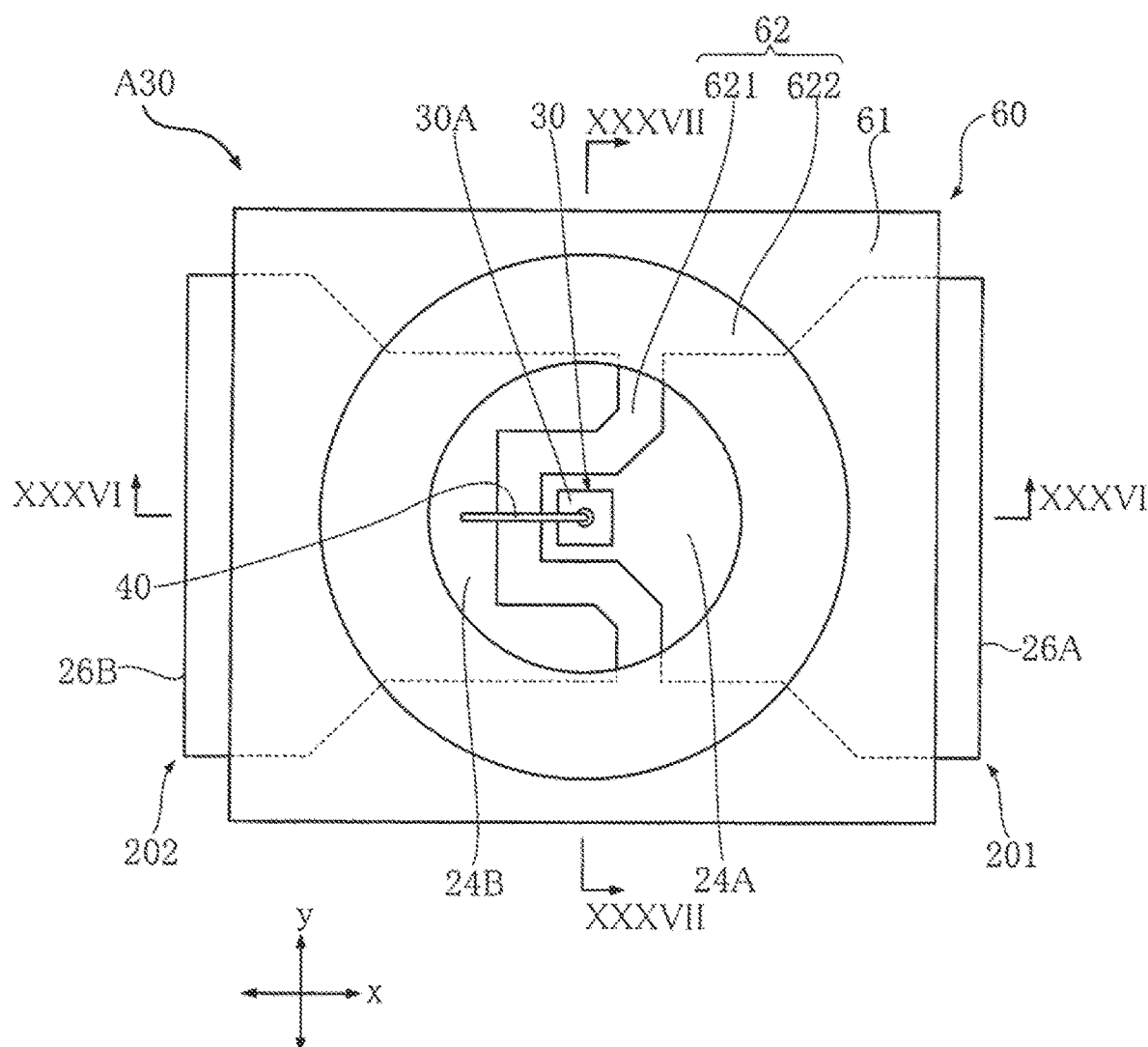
FIG. 34 is a top view (through the sealing resin) of the LED package shown in FIG. 33.
Figure 38:
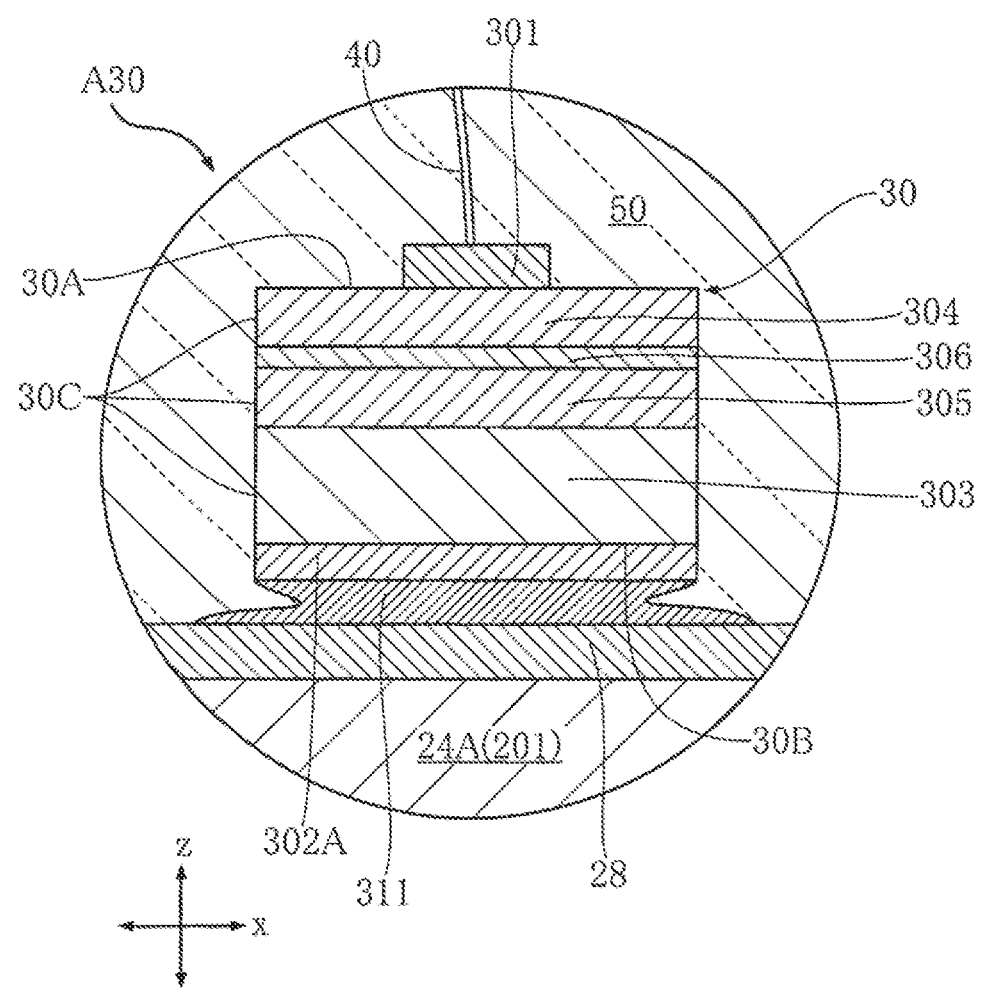
FIG. 38 is a partial enlargement view (near the LED chip) of the LED package shown in FIG. 36.
Figure 39:
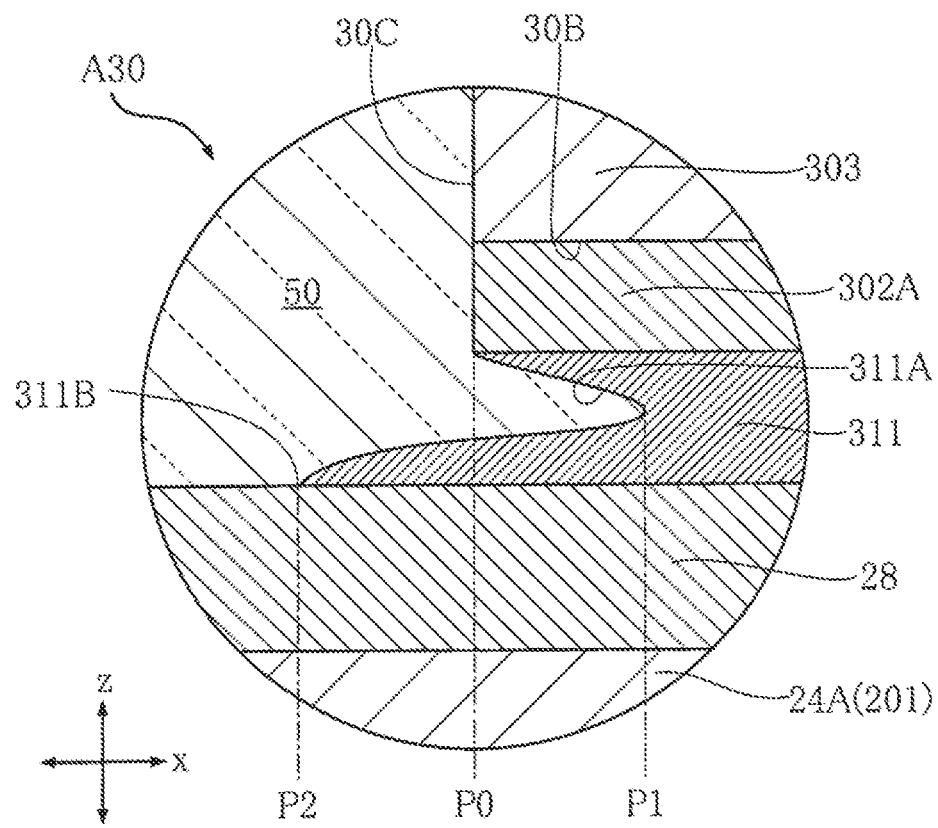
FIG. 39 is a partial enlargement view (near the first bonding layer) of the LED package shown in FIG. 38.
Figure 40:
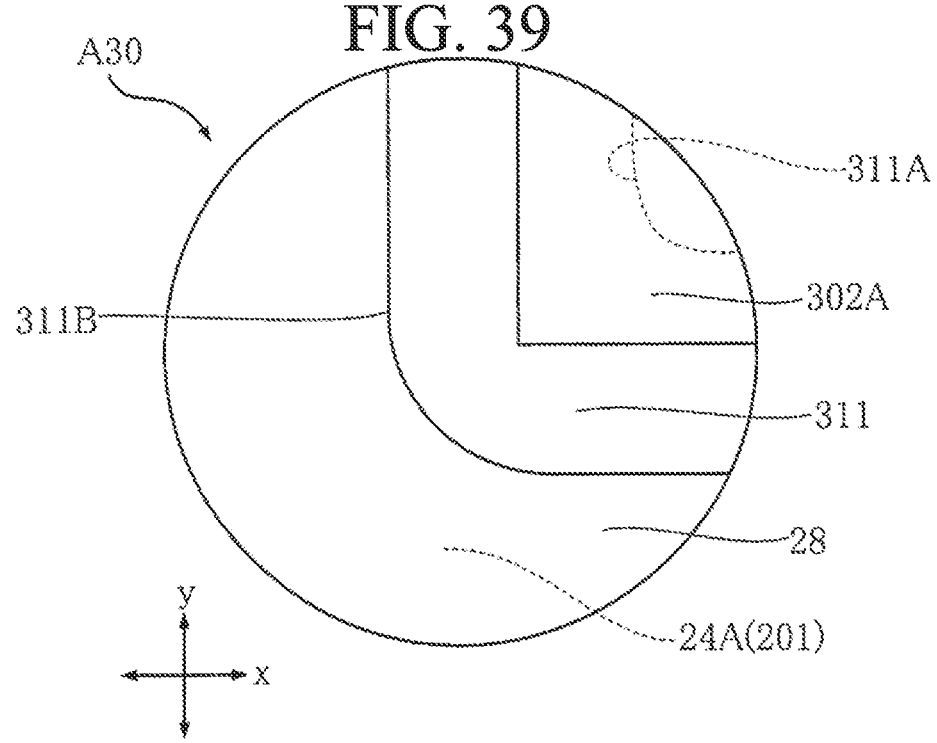
FIG. 40 is a partial enlargement view (near the LED chip) of the LED package shown in FIG. 34.

The LED package A30 according to the third embodiment of the present invention is discussed with reference to FIG. 33 to FIG. 40. In these drawings, the elements that are the same as or similar to those of the above-described LED package A10 are denoted by the same or similar reference numerals, and repetitive description related to these elements are omitted. Here, FIG. 33 and FIG. 34 are illustrated through the sealing resin 50 to facilitate the understanding of the present embodiment. To facilitate the understanding, the components of the LED chip 30 other than the first back electrode 302A are shown in FIG. 40.

The LED package A30 differs from the above-mentioned LED package A10 in the configuration of the first terminal 201 and the second terminal 202, and a case is used to substitute for the substrate 10. As illustrated in FIG. 33, the LED package A30 is a surface-mount package in which the first terminal 201 and the second terminal 202 are both supported by the case 60. Further, as illustrated in FIG. 38 to FIG. 40, the configuration of the LED chip 30 and the first bonding layer 311 of the present embodiment is the same as the configuration of the LED chip 30 and the first bonding layer 311 of the LED package A10. Therefore, the discussion regarding the LED chip 30 and the first bonding layer 311 is omitted here.

As illustrated in FIG. 34 to FIG. 37, the first terminal 201 is a conductive part mounting the LED chip 30 and conducted with the first back electrode 302A. The first terminal 201 is composed of a lead frame comprising Cu in its composition. The thickness of the first terminal 201 is 100 to 200 µm. The first terminal 201 has a first connecting portion 24A, a first mounting portion 25A, and a first coupling portion 26A.

Figure 35:
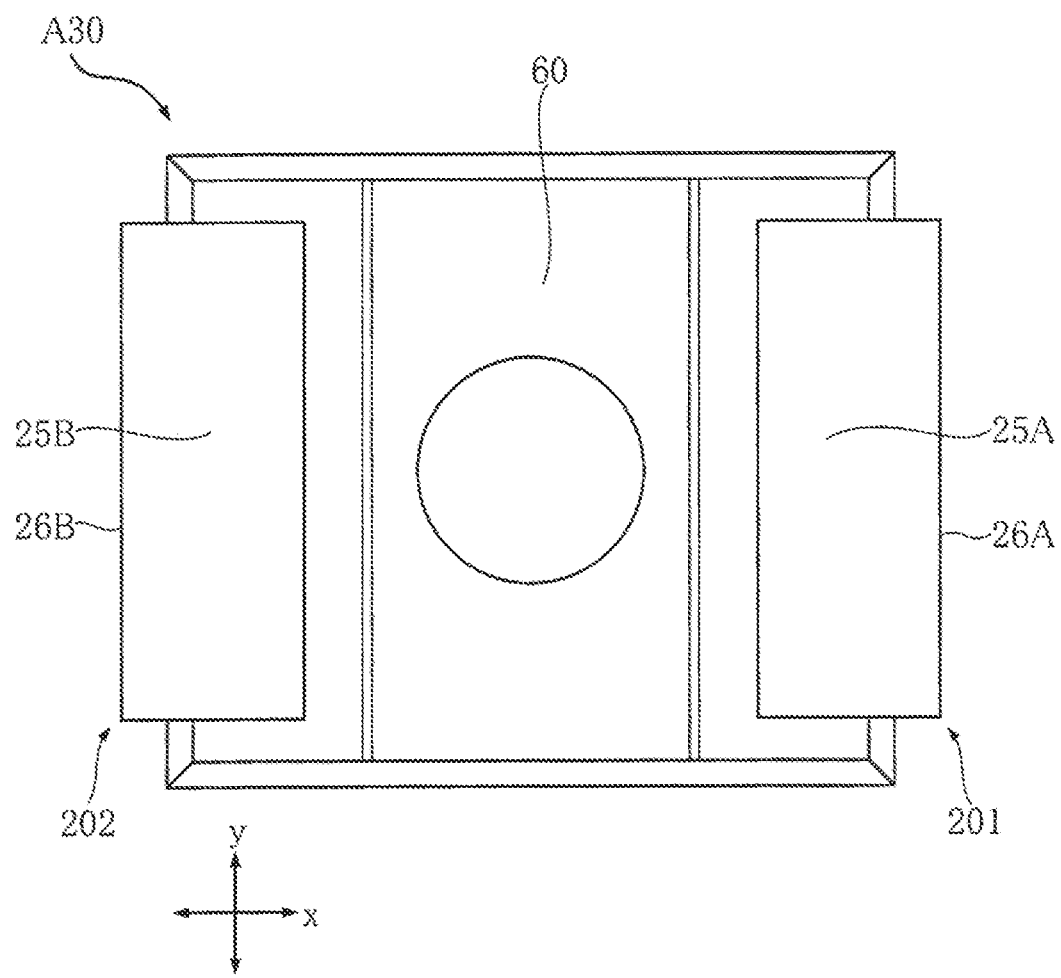
FIG. 35 is a bottom view (through the sealing resin) of the LED package shown in FIG. 33.
Figure 36:
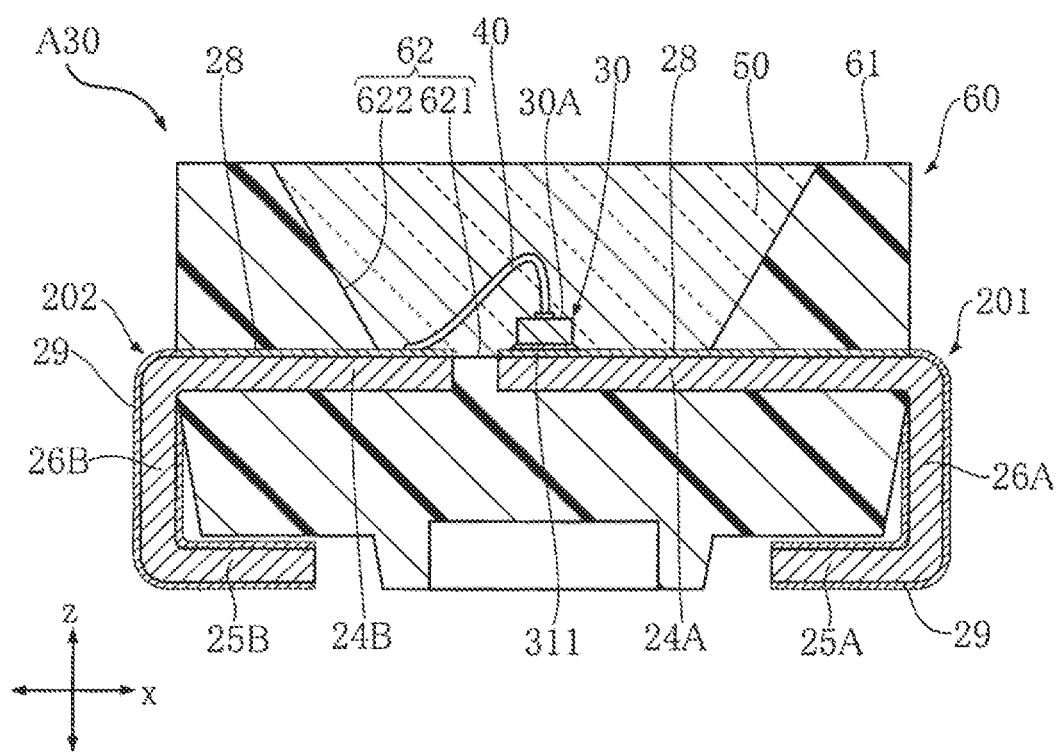
FIG. 36 is a sectional view taken along the line XXXVI-XXXVI in FIG. 34.
Figure 37:
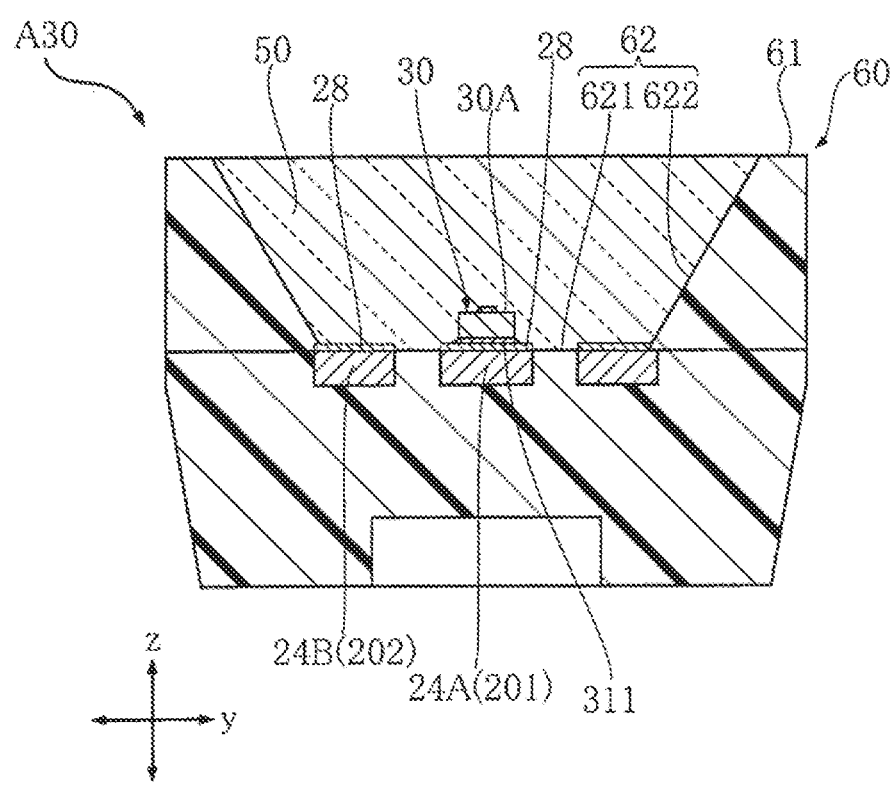
FIG. 37 is a sectional view taken along the line XXXVII-XXXVII in FIG. 34.

As illustrated in FIG. 34 to FIG. 37 (except FIG. 35), the first connecting portion 24A is the portion disposed along both the first direction x and the second direction y, and is configured to mount the LED chip 30. A portion of the first connecting portion 24A is covered by the case 60. The portion of the first connecting portion 24A that is covered by the case 60 is sandwiched between the case from both sides in the thickness direction z. Therefore, the first terminal 201 is supported by the case 60 at the first connecting portion 24A. As shown in FIGS. 36 and 37, an internal conductive layer 28 is formed on a surface (the surface facing upward in FIG. 36) facing in the same direction as the front 30A of the LED chip 30 in the first connection portion 24A. In the LED package A30, the internal conductive layer 28 is an Ag-plated layer. The internal conductive layer 28 may be a plurality of plated layers comprising a Pd-plated layer and an Au-plated layer that are deposited sequentially.

As illustrated in FIG. 36 and FIG. 37, the first mounting portion 25A is the portion disposed along both the first direction x and the second direction y, and is spaced apart from the first connecting portion 24A in the thickness direction z. The first mounting portion 25A is provided outside the LED package A30. As illustrated in FIG. 37, an external conductive layer 29 is formed at the first mounting portion 25A on the surface facing the thickness direction z. In the LED package A30, the external conductive layer 29 is an Ag-plated layer or a plurality of plated layers comprising a Pd-plated layer and an Au-plated layer that are deposited sequentially. The external conductive layer 29 may further comprise a Sn-plated layer covering the above-mentioned plated layers.

As illustrated in FIG. 34 to FIG. 36, the first coupling portion 26A is a portion disposed along both the second direction y and the thickness direction z and connects the first connecting portion 24A and the first mounting portion 25A. The first coupling portion 26A is located outside the LED package A30. As illustrated in FIG. 36, an external conductive layer 29 is formed at the first coupling portion 26A on the surface facing the first direction x.

As illustrated in FIG. 34 to FIG. 36, the second terminal 202 is a conductive portion that is spaced apart from the first terminal 201 in the first direction x and is conducted with the front-side electrode 301 via the wire 40. The second terminal 202 and the first terminal 201 are formed with the same lead frame. Therefore, the composition and the thickness of the second terminal 202 is the same as the composition and the thickness of the first terminal 201. The second terminal 202 comprises a second connecting portion 24B, a second mounting portion 25B, and a second coupling portion 26B.

As illustrated in FIG. 34 to FIG. 37 (except FIG. 35), the second connecting portion 24B is a portion disposed along both the first direction x and the second direction y and is connected with the wire 40. A portion of the second connecting portion 24B is covered by the case 60. The portion of the second connecting portion 24B that is covered by the case 60 is sandwiched between the case from both sides in the thickness direction z. Therefore, the second terminal 202 is supported by the case 60 at the second connecting portion 24B. As shown in FIG. 36 and FIG. 37, an internal conductive layer 28 is formed on a surface (the surface facing upward in FIG. 35) facing in the same direction as the front 30A of the LED chip 30 in the second connection portion 24B.

As illustrated in FIG. 35 and FIG. 36, the second mounting portion 25B is a portion disposed along both the first direction x and the second direction y and is spaced apart from the second connecting portion 24B in the thickness direction z. The second mounting portion 25B is provided outside the LED package A30. As illustrated in FIG. 36, an external conductive layer 29 is formed on the surface facing in the thickness direction z in the second mounting portion 25B.

As illustrated in FIG. 34 to FIG. 36, the second coupling portion 26B is a portion disposed along both the second direction y and the thickness direction z and connects the second connecting portion 24B and the second mounting portion 25B. The second coupling portion 26B is provided outside the LED package A30. As illustrated in FIG. 36, an external conductive layer 29 is formed on the surface facing in the first direction x in the second coupling portion 26B.

As illustrated in FIG. 33 to FIG. 37, the case 60 is the part that supports the first terminal 201 and the second terminal 202. The case 60 is made of white, synthetic resin. The materials forming the case 60 are, for example, polyphthalamide (PPA) or liquid crystal polymer (LCP). Note that the material of the case 60 is not limited to these, but various materials may be used as long as they are materials having a high mechanical strength and excellent heat resistance.

The case 60 has a top surface 61 and a dent 62.

As illustrated in FIG. 34 to FIG. 37 (except FIG. 35), the top surface 61 faces the same direction as the front 30A of the LED chip 30 does. Further, as illustrated in FIG. 33 to FIG. 37 (except FIG. 35), the dent 62 is a hollow region recessed from the top surface 61 toward the thickness direction z. The dent 62 is configured to accommodate the LED chip 30, the wire 40, and the sealing resin 50. The dent 62 comprises a bottom surface 621 and an inner peripheral surface 622. The bottom surface 621 is configured to be parallel with the top surface 61 and an outer periphery thereof is circular. A respective portion of the first connecting portion 24A of the first terminal 201 and the second connecting portion 24B of the second terminal 202 is exposed from the bottom surface 621. The inner peripheral surface 622 connects the inner periphery of the circular top surface 61 and the outer periphery of the bottom surface 621, and surrounds the LED chip 30. The inner peripheral surface 622 is a curved surface that tilts relative to the bottom surface 621. Therefore, the dent 62 is a hollow region having a truncated cone shape. Further, as illustrated in FIG. 39, the sealing resin 50 accommodated in the dent 62 is in contact with the first bent portion 311A of the first bonding layer 311.

Next, the functions and effects of the LED package A30 are described.

The present LED package A30 comprises the first bonding layer 311 having the same composition as that of the LED package A10. Therefore, the moisture absorption of the first bonding layer 311 is prevented, so that it is possible to avoid a reduction in power supply efficiency to the LED chip 30, and to adopt the LED chip 30 of higher output. Further, the cracking of the first bonding layer 311 caused by the thermal strain generated by the LED chip 30 can be prevented. Therefore, according to the LED package A30, it is also possible to ensure the reliability of the LED package A30 during use while at the same time adopting the LED chip 30 of a higher power output.

The LED package A30 comprises a case 60 having a dent 62 for accommodating the LED chip 30. The dent 62 has an inner peripheral surface 622 which tilts with respect to the bottom surface 621 and surrounds the LED chip 30. By adopting such configuration, the light emitted from the LED chip 30 is reflected on the inner peripheral surface 622, and the light is diffused in the dent 62. This contributes to the improvement of the luminance of the light emitted from the LED package A30.

The composition of the first bonding layer 311 of the LED package A30 is the same as the composition of the first bonding layer 311 of the LED package A10. Therefore, when the LED chip 30 is bonded to the first terminal 201 (the first connecting portion 24A) by reflowing, it is feasible to prevent the case 60 from being burnt.

The present invention is not limited to the above-described embodiments. Various modifications to the specific configuration of each part of the present invention can be made freely.

What is claimed is:

1. A light emitting diode (LED) package, comprising:
an LED chip, comprising:
a front and a back, facing in opposite orientations with each other along a thickness direction, and
a first back electrode, provided at the back;
a first terminal, in conduction with the first back electrode; and
a first bonding layer, configured to bond the first back electrode and the first terminal;
wherein when viewed in the thickness direction of the LED chip, a first bent portion is disposed on the first bonding layer, the first bent portion being recessed toward an inner side of a periphery of the first back electrode, and
wherein when viewed in the thickness direction of the LED chip, a junction between the first terminal and the first bonding layer comprises a section located farther outside than the periphery of the first back electrode.

2. The LED package of claim 1, wherein when viewed in the thickness direction of the LED chip, the section of the junction between the first terminal and the first bonding layer is located farther outside than a periphery of the back.

3. The LED package of claim 1, wherein when viewed in the thickness direction of the LED chip, the periphery of the first back electrode is located farther inside than a periphery of the back.

4. The LED package of claim 3, wherein when viewed in the thickness direction of the LED chip, the section of the junction between the first terminal and the first bonding layer is located between the periphery of the back and the periphery of the first back electrode.

5. The LED package of claim 3, wherein when viewed in the thickness direction of the LED chip, the section of the junction between the first terminal and the first bonding layer is located farther outside than the periphery of the back and the periphery of the first back electrode.

6. The LED package of claim 1, wherein a composition of the first bonding layer is a metal eutectic composition comprising Au.

7. The LED package of claim 1, wherein a composition of the first bonding layer comprises at least one of Sn and In.

8. The LED package of claim 1, wherein the LED chip further comprises:
a cutting surface, intersecting with the back, wherein the cutting surface tilts relative to the back.

9. The LED package of claim 1, further comprising:
a sealing resin, covering the LED chip and having transparency;
wherein the sealing resin is in contact with the first bent portion.

10. The LED package of claim 9, wherein the sealing resin comprises epoxy.

11. The LED package of claim 9, further comprising:
a second terminal, separated from the first terminal in a direction orthogonal to the thickness direction of the LED chip;

wherein the LED chip further comprises:
a front-side electrode, provided at the front, wherein the front-side electrode is in conduction with the second terminal.

12. The LED package of claim 11, further comprising:
a wire, connecting the front-side electrode and the second terminal.

13. The LED package of claim 11, further comprising:
a substrate, configured to support the first terminal and the second terminal, and comprising:
a substrate front facing the same orientation as the front; and
a substrate back facing an orientation opposite from the substrate front;
wherein the first terminal and the second terminal respectively comprise:
a front portion, provided at the substrate front;
a back portion, provided at the substrate back; and
a middle portion, configured to connect the front portion and the back portion.

14. The LED package of claim 13, wherein the substrate further comprises a pair of substrate sidewalls intersecting with the substrate front and the substrate back, and the pair of substrate sidewalls are separated from each other in a direction that is the same as the direction in which the first terminal is separated from the second terminal;
wherein the substrate has a groove recessed from each of the substrate sidewalls, and reaches the substrate back from the substrate front,
wherein the middle portion is located in the groove.

15. The LED package of claim 11, further comprising:
a case made of a synthetic resin, configured to support the first terminal and the second terminal, and comprising:
a top surface, facing in the same orientation as the front; and
a dent, recessed from the top surface;
wherein the LED chip and the sealing resin are accommodated in the dent.

16. The LED package of claim 15, wherein the dent comprises:
a bottom surface, configured to be parallel with the top surface; and
an inner peripheral surface, configured to connect the top surface and the bottom surface, and surround the LED chip;
wherein the inner peripheral surface tilts relative to the bottom surface.

17. The LED package of claim 16, wherein respective portions of the first terminal and the second terminal are exposed from the bottom surface.

18. The LED package of claim 9, wherein the LED chip further comprises a second back electrode, provided in the back and separated from the first back electrode, and the LED package further comprises:
a second terminal, separated from the first terminal in a direction orthogonal to the thickness direction of the LED chip, the second terminal being in conduction with the second back electrode; and
a second bonding layer, configured to bond the second back electrode and the second terminal;
wherein a composition of the second bonding layer is the same as a composition of the first bonding layer; and
wherein the second bonding layer has a second bent portion recessed toward the inner side of a periphery of the second back electrode, when viewed in the thickness direction of the LED chip.

19. The LED package of claim 18, wherein a junction between the second terminal and the second bonding layer comprises a section located farther outside than the periphery of the second back electrode, when viewed in the thickness direction of the LED chip.

20. The LED package of claim 18, wherein the sealing resin is in contact with the second bent portion.

\* \* \* \* \*